(12) United States Patent
Kwak et al.

(10) Patent No.: US 9,368,166 B2
(45) Date of Patent: Jun. 14, 2016

(54) NONVOLATILE MEMORY DEVICES, MEMORY SYSTEMS, AND CONTROL METHODS USING SIMULTANEOUS RECOVERY AND OUTPUT OPERATIONS

(71) Applicants: Donghun Kwak, Hwaseong-Si (KR); Hyun Jun Yoon, Seongnam-Si (KR); Dongkyo Shim, Seoul (KR)

(72) Inventors: Donghun Kwak, Hwaseong-Si (KR); Hyun Jun Yoon, Seongnam-Si (KR); Dongkyo Shim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 83 days.

(21) Appl. No.: 14/153,627

(22) Filed: Jan. 13, 2014

(65) Prior Publication Data
US 2014/0204684 A1    Jul. 24, 2014

(30) Foreign Application Priority Data
Jan. 18, 2013    (KR) .......................... 10-2013-0005922

(51) Int. Cl.
G11C 7/10        (2006.01)
G11C 16/26     (2006.01)
G11C 16/04     (2006.01)

(52) U.S. Cl.
CPC ........ *G11C 7/10* (2013.01); *G11C 16/26* (2013.01); *G11C 7/1063* (2013.01); *G11C 16/0483* (2013.01)

(58) Field of Classification Search
CPC ................................ G11C 7/1051; G11C 7/10
USPC ........................................................ 365/189.05
See application file for complete search history.

(56) References Cited

U.S. PATENT DOCUMENTS

| | | | |
|---|---|---|---|
| 5,768,215 A * | 6/1998 | Kwon et al. | 365/238.5 |
| 6,813,214 B2 * | 11/2004 | Cho et al. | 365/230.04 |
| 6,847,558 B1 | 1/2005 | Fischaber et al. | |
| 7,123,536 B2 | 10/2006 | Kang | |
| 7,403,446 B1 * | 7/2008 | Parameswaran et al. | 365/233.1 |
| 7,447,078 B2 | 11/2008 | Li | |
| 7,562,180 B2 | 7/2009 | Gyl et al. | |
| 7,609,553 B2 | 10/2009 | Hwang | |
| 8,438,453 B2 | 5/2013 | Post et al. | |
| 2007/0139992 A1 * | 6/2007 | Nitta | G11C 7/1027 365/63 |
| 2014/0104960 A1 * | 4/2014 | Iyer et al. | 365/189.05 |

* cited by examiner

*Primary Examiner* — Han Yang
*Assistant Examiner* — Jerome Leboeuf
(74) *Attorney, Agent, or Firm* — Volentine & Whitt, PLLC

(57) ABSTRACT

A nonvolatile memory device includes a cell array including a plurality of cell strings extending on a substrate in a vertical direction, a page buffer connected to a plurality of bit lines and configured to store sensing data of the cell array in a sensing operation, a voltage generator configured to provide voltages to a plurality of word lines and the plurality of bit lines, and an input/output buffer configured to temporarily store the sensing data received in a data dump from the page buffer and to output the temporarily stored data to an external device. The nonvolatile memory device further includes control logic configured to set a status of the nonvolatile memory device to a ready state after the sensing data is dumped to the input/output buffer and before recovery of the cell array from a bias voltage of the sensing operation is complete.

14 Claims, 17 Drawing Sheets

Fig. 10

| Data Size | Data Out Period($\mu s$) | | | | |
|---|---|---|---|---|---|
| | 100MHz | 133MHz | 166MHz | 200MHz | 266MHz |
| 4KB | 10 | 10 | 10 | 10 | 10 |
| 8KB | 20 | 20 | 20 | 20 | 20 |
| 16KB | 40 | 40 | 40 | 40 | 40 |

NONVOLATILE MEMORY DEVICES, MEMORY SYSTEMS, AND CONTROL METHODS USING SIMULTANEOUS RECOVERY AND OUTPUT OPERATIONS

CROSS-REFERENCE TO RELATED APPLICATIONS

A claim for priority under 35 U.S.C. §119 is made to Korean Patent Application No. 10-2013-0005922 filed Jan. 18, 2013, in the Korean Intellectual Property Office, the entire contents of which are hereby incorporated by reference.

BACKGROUND

The inventive concepts described herein relate to semiconductor memories, and more particularly, to a nonvolatile memory device, to a memory system including a nonvolatile memory device, and to a method of controlling a memory system including a nonvolatile memory device.

Semiconductor memory devices may be volatile or nonvolatile. Volatile semiconductor memory devices are generally characterized by the loss of contents stored therein in a power-off state, whereas nonvolatile semiconductor memory devices are generally characterized by the retention of contents stored therein in a power-off state.

Flash memory is one example of a nonvolatile semiconductor memory device which has been widely adopted in electronics industries. Flash memory may be used to store large quantities of voice, image data and other date in information appliances such as a computer, a cellular phone, a PDA, a digital camera, a camcorder, a voice recorder, an MP3 player, a handheld PC, a game machine, a facsimile, a scanner, a printer, and the like.

In the meantime, in an effort to meet the continuing demand for highly integrated memory devices, research has focused on the development of nonvolatile memory devices (hereinafter, referred to as a three-dimensional nonvolatile memory devices) where memory cells are arranged in three-dimensions. However, due to relatively large loads attendant three-dimensional nonvolatile memory devices, challenges are encountered in the realization of devices exhibiting high operating speeds.

SUMMARY

One aspect of embodiments of the inventive concept is directed to provide a nonvolatile memory device which includes a cell array including a plurality of cell strings extending on a substrate in a vertical direction, memory cells in each of the cell strings being controlled by a plurality of word lines and a plurality of bit lines. The nonvolatile memory device further includes a page buffer connected to the plurality of bit lines and configured to store sensing data of the cell array in a sensing operation, a voltage generator configured to provide voltages to the plurality of word lines and the plurality of bit lines, and an input/output buffer configured to temporarily store the sensing data received in a data dump from the page buffer and to output the temporarily stored data to an external device. The nonvolatile memory device still further includes control logic configured to set a status of the nonvolatile memory device to a ready state after the sensing data is dumped to the input/output buffer and before recovery of the cell array from a bias voltage of the sensing operation is complete.

Another aspect of embodiments of the inventive concept is directed to provide a memory system which includes a nonvolatile memory device configured to sense and latch data of selected memory cells in response to a read command, to output the latched data as read data, and to set a ready/busy signal to a ready state before a recovery operation on the selected memory cells is completed. The memory system further includes a memory controller configured to control the nonvolatile memory device based on the ready/busy signal such that the read data is output and to issue a next command after a reference time elapses from a point of time when the ready/busy signal is set to the ready state.

Still another aspect of embodiments of the inventive concept is directed to provide a control method of a nonvolatile memory device which includes providing a first command to the nonvolatile memory device, detecting a point of time when a ready/busy signal of the nonvolatile memory device transitions from a busy state to a ready state, and providing a second command to the nonvolatile memory device. Issuance of the second command to the nonvolatile memory device is prohibited before a reference time elapses from the point of time the ready/busy signal transitions from the busy state to the ready state.

Yet another aspect of embodiments of the inventive concept is directed to provide a control method of a memory system, where the memory system includes a memory controller and a nonvolatile memory device. The control method includes transmitting a read command from the memory controller to the nonvolatile memory device, transitioning a busy/ready status signal of the nonvolatile memory device from a ready state to a busy state, sensing data of a memory cell array of the nonvolatile memory device by latching the data in a page buffer of the nonvolatile memory device, dumping the data from the page buffer to an input/output buffer of the nonvolatile memory device, performing a recovery operation of the memory cell array, and transitioning the busy/ready status signal of the nonvolatile memory device from the busy state to the ready state prior to completion of the recovery operation of the memory cell array.

BRIEF DESCRIPTION OF THE FIGURES

The above and other aspects and features will become apparent from the detailed description that follows, with reference to the accompanying figures, wherein like reference numerals refer to like parts throughout the various figures unless otherwise specified, and wherein:

FIG. 10 is a table illustrating examples of minimum wait times relative to data size of data read requested by a memory controller of FIG. 9;

DETAILED DESCRIPTION

Figure 1:
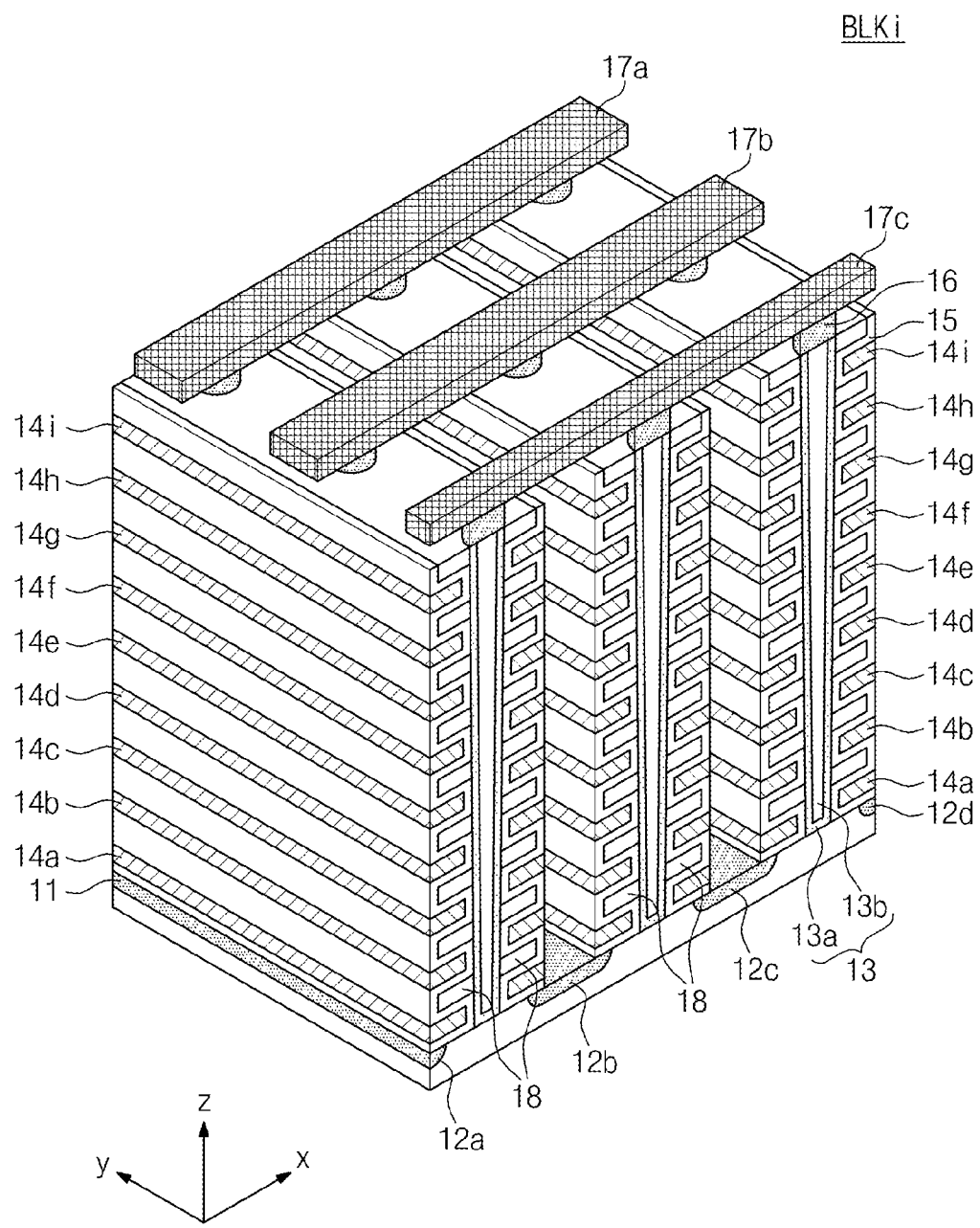
FIG. 1 is a perspective view of a memory block BLKi of a nonvolatile memory device according to an embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Below, features and functions of the inventive concept will be exemplarily described using a flash memory device as a nonvolatile storage medium. However, the inventive concept is not limited thereto. For example, the storage medium may be formed of a PRAM, an MRAM, a ReRAM, a FRAM, a NOR flash memory, or the like. In addition, the inventive concept may be applied to semiconductor devices supplied with a high voltage from an external device.

The inventive concept may be implemented by different embodiments or applied thereto. Further, detailed description may be modified or changed according to viewpoints and applications without escaping from the scope, spirit and other objects of the inventive concept. Below, the inventive concept will be described with reference to accompanying drawings.

FIG. 1 is a perspective view of a memory block BLKi of a nonvolatile memory device according to an embodiment of the inventive concept. Referring to FIG. 1, a memory block BLKi may include structures extending in axial directions x, y, and z.

A plurality of doping regions 12a, 12b, 12c, and 12d may be formed at a substrate 11 lengthwise along the x-direction. A plurality of insulation materials 18 also extending the y-direction may be sequentially arranged in the z-direction and formed on the substrate between the first and second doping regions 12a and 12b. A plurality of insulating materials 18 may also be similarly arranged between the second and third doping regions 12b and 12c, and between the third and fourth doping regions 12c and 12d. As shown, the insulation materials 18 may be formed to be spaced apart from one another along the z-direction.

On the substrate 11, pillars 13 may be sequentially arranged in the y-direction between the first and second doping regions 12a and 12b, and be formed to penetrate the insulation materials 18 along the z-direction. Here, the pillars 13 may also be formed on the substrate 11 between the second and third doping regions 12b and 12c, and on the substrate 11 between the third and fourth doping regions 12c and 12d.

A surface layer 13a of the pillar 13 may include a silicon material having the same type as that of the substrate 11. An inner layer 13b of the pillar 13 may be formed of an insulation material. For example, the inner layer 13b of the pillar 13 may include an insulation material such as silicon oxide.

An insulation film 15 may be provided between the first and second doping regions 12a and 12b along exposed surfaces of the insulation materials 18, the pillars 18, and the substrate 11. In example embodiments, the insulation film 15 is provided on an exposed surface (e.g., exposed in the z-direction) of the last insulation material 18 provided along the z-direction.

First conductive materials 14a to 14i may be provided on the exposed surface of the insulation film 15 between the first and second doping regions 12a and 12b, respectively. For example, a first conductive material 14a extending along the y-direction may be provided between the substrate 11 and an insulation film 18 adjacent to the substrate 11. In detail, the first conductive material 14a extending along the x-direction may be provided between the substrate 11 and an insulation film 15 on a lower surface of the insulation material 18 adjacent to the substrate 11.

The same structure as that between the first and second doping regions 12a and 12b may be provided between the second and third doping regions 12b and 12c, and the same structure as that between the first and second doping regions 12a and 12b may be provided between the third and fourth doping regions 12c and 12d.

Drains 16 may be provided on the pillars 13. The drains 16 may be formed of an n-type silicon material. Second conductive materials 17a to 17c extending along the x-direction may be provided on the drains 16. The second conductive materials 17a to 17c may be sequentially disposed along the y-direction. The second conductive materials 17a to 17c may be connected with the drains 16 at corresponding areas. For example, the drains 16 and the second conductive material 17c extending along the x-direction may be interconnected through contact plugs.

Here, the first conductive materials 14a to 14i may form word lines and selection lines. The first conductive materials 14b to 14h used as word lines may be formed such that conductive materials belonging to the same layer are interconnected. The memory block BLKi may be selected by selecting all of the first conductive materials 14a to 14i. The inventive concept is not limited by the number of first conductive materials 14a to 14i illustrated by way of example in FIG. 1. That is, the number of first conductive materials 14a to 14i may be changed as desired, for example, by process techniques and/or control techniques that are adopted.

Figure 2:
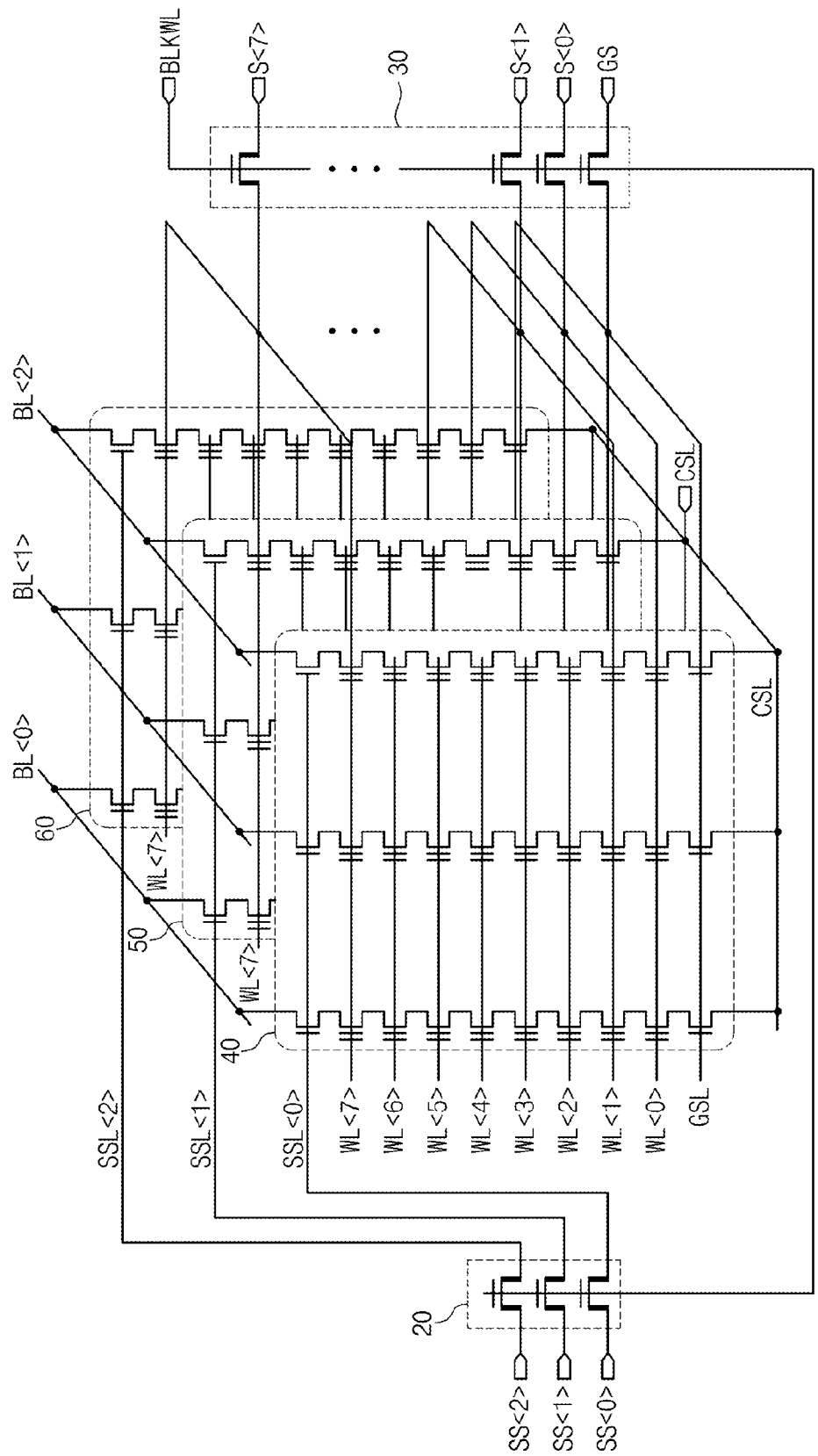
FIG. 2 is a schematic circuit diagram of a memory block selection architecture according to an embodiment of the inventive concept.

FIG. 2 is a schematic circuit diagram of a memory block selection architecture according to an embodiment of the inventive concept. Referring to FIG. 2, a memory block may include a plurality of cell strings. The memory block may be connected with a plurality of string selection lines SSL<0> to SSL<2> for selecting a plurality of cell strings.

One of the memory blocks may be selected by activating a block selection signal BLKWL provided to a memory block to be selected. Pass transistors 20 and 30 of a decoder may be turned on or off by the block selection signal BLKWL. Selection signals SS<0> to SS<2> may be transferred to string selection lines SSL<0> to SSL<2> through the pass transistor 20. Driving signals S<0> to S<7> and GS may be transferred to word lines WL<0> to WL<7> and a ground selection line GSL through the pass transistor 30.

If the selection signal SS<00> is activated, cell strings connected with the string selection line SSL<0> may be electrically connected with bit lines BL<0> to BL<2>, respectively. Under this condition, memory cells included in a memory unit 40 may be accessed by applying the driving signals S<0> to S<7>. When the selection signal SS<1> is activated, cell strings connected with the string selection lines SSL<1> may be electrically connected with the bit lines BL<0> to BL<2>. Under this condition, memory cells included in a memory unit 50 can be programmed. When the selection signal SS<2> is activated, cell strings connected with the string selection lines SSL<2> may be electrically connected with the bit lines BL<0> to BL<2>. Under this condition, memory cells included in a memory unit 60 can be programmed.

The selection signals SS<j>, the driving signals S<k> and the block selection signals BLKWL may be provided through the pass transistors 20 and 30 to select one memory block and to select a specific word line of the selected memory block.

For simplicity, FIG. 2 illustrates examples of control signals for selecting a word line. However, it will be understood that various other signals and voltages may be applied, such as voltages applied to a bulk, bit lines, common source lines, and so on. After a given memory operation, a recovery operation for discharging applied voltages may be required before a next operation can be performed. The associated recovery time of the three-dimensional nonvolatile memory device illustrated in FIG. 2 may increase due to relatively large resistive and capacitive components. This can adversely delay execution of the next memory operation.

As will be explained below, embodiments of the inventive concept relate to techniques for overcoming problems associated with the increase in recovery time discussed above.

Figure 3:
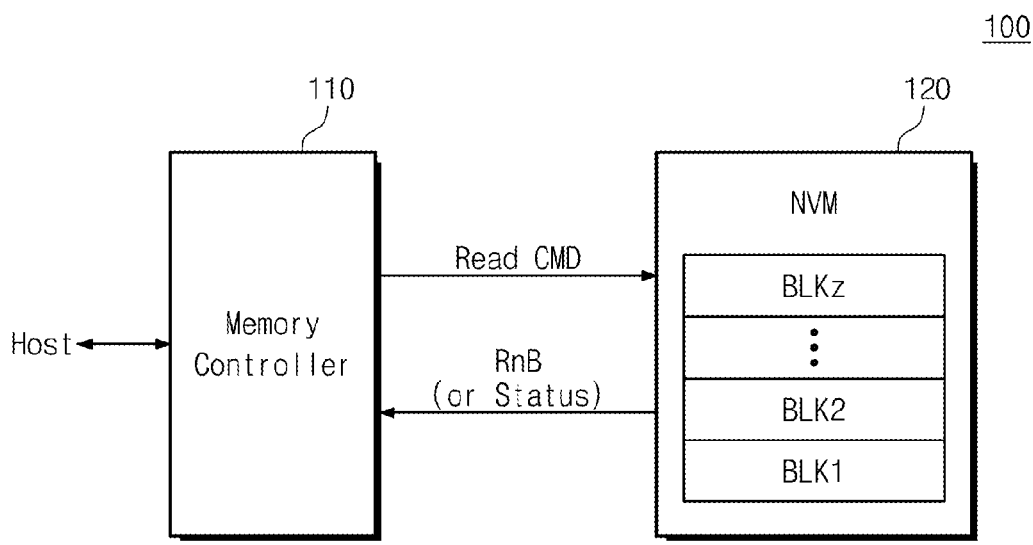
FIG. 3 is a block diagram schematically illustrating a memory system according to an embodiment of the inventive concept.

FIG. 3 is a block diagram schematically illustrating a memory system according to an embodiment of the inventive concept. Referring to FIG. 3, a memory system 100 may include a memory controller 110 and a nonvolatile memory device 120.

The memory controller 110 may control the nonvolatile memory device 120 in response to a request of a host. The memory controller 110 may provide an interface between the host and the nonvolatile memory device 120. The memory controller 110 may control a write operation of the nonvolatile memory device 120 in response to a write request of the host. The memory controller 110 may control a read operation of the nonvolatile memory device 120 in response to a read request of the host.

The memory controller 110 may access the nonvolatile memory device 120 based on a ready/busy signal RnB or status data from the nonvolatile memory device 120. For example, when the ready/busy signal RnB has a ready state (e.g., a high level), the memory controller 110 may provide a read command to the nonvolatile memory device 120. In response to an input of the read command, the ready/busy signal RnB of the nonvolatile memory device 120 may transition from the high level to a busy state (e.g., a low level) to perform a read operation. If the read operation is ended, the nonvolatile memory device 120 may set the ready/busy signal RnB to the high level. The memory controller 110 may provide a read enable signal /RE to the nonvolatile memory device 120 in response to a low-to-high transition of the read enable signal /RE, and the nonvolatile memory device 120 may output read data.

In response to the read command, the nonvolatile memory device 120 may generate a bias for sensing selected memory cells. The nonvolatile memory device 120 may sense the selected memory cells based on the generated bias. The sensed data may be dumped from a page buffer (not shown in FIG. 3) of the nonvolatile memory device 120 to an output buffer (not shown in FIG. 3) thereof. Once the read data is dumped to the output buffer, the nonvolatile memory device 120 may set the ready/busy signal RnB to a high level before or during a recovery operation. At the same time, the nonvolatile memory device 120 may perform the recovery operation to discharge a current or voltage bias provided to memory cells selected for access.

As will be explained herein, even when the ready/busy signal RnB transitions from a low level (busy state) to a high level (ready state) some time after the read command is provided to the nonvolatile memory device 120, the memory controller 110 may not issue a next command for a predetermined time after the transition. That is, the memory controller 110 may issue the next command after the lapse of time needed to complete a recovery operation of the nonvolatile memory device 120.

With the memory system 100 of the inventive concept, the nonvolatile memory device 120 may output a high level (ready state) of ready/busy signal RnB or output ready status data before the recovery operation is completed. Nonetheless, the memory controller 110 may not issue a next command until a predetermined time thereafter has elapsed.

Figure 4:
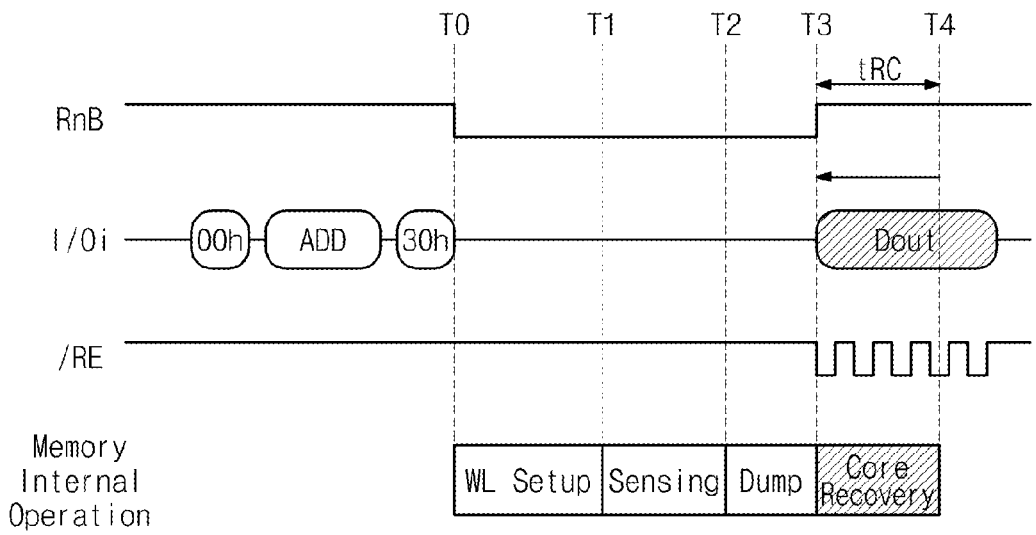
FIG. 4 is a timing diagram schematically illustrating an example of an operation of the memory system of FIG. 3.

FIG. 4 is a timing diagram schematically illustrating an operational example of the memory system of FIG. 3. As will be described with reference to FIG. 4, a memory controller 110 may fetch read data before core recovery of a nonvolatile memory device 120 is terminated.

During a high-level (ready state) period of a ready/busy signal RnB, the memory controller 110 may issue a read command (00h, ADD, 30h) through input/output terminals I/Oi to the nonvolatile memory device 120. When an input of the read command is completed, the nonvolatile memory device 120 may transition the ready/busy signal RnB to a low level (busy state). Alternatively, the nonvolatile memory device may be responsive to a status read command received through the input/output terminals I/Oi to transmit ready/busy status data to the memory controller 110.

The nonvolatile memory device 120 may generate a word line voltage to be provided to a selected memory area in response to the read command, and the word line voltage may be applied to the selected memory area. This operation may be a word line setup interval corresponding to a time section T0 to T1 of FIG. 4. Then, the nonvolatile memory device 120 may sense and latch cells of the selected memory area. This operation may be a sensing interval corresponding to a time section T1 to T2 of FIG. 4. The sensed data may be dumped to an output buffer. This operation may be a dump interval corresponding to a time section T2 to T3 of FIG. 4.

The nonvolatile memory device 120 may perform a core recovery operation at a point of time T3 when dumping of the sensing data to the output buffer is completed. Here, the core recovery operation may be performed to discharge a bulk, word lines, bit lines, selection lines, a common source line, etc. associated with the selected memory cells. Also, the nonvolatile memory device 120 may set a ready/busy signal RnB to a high level (ready state) at a point of time T3 when dumping of the sensing data to the output buffer is completed. To output data of the nonvolatile memory device 120 to an external device may be possible from a point of time when the ready/busy signal RnB transitions to a high level. If the memory controller 110 provides a read enable signal /RE to the nonvolatile memory device 120 in response to a low-to-high transition of the ready/busy signal RnB, the nonvolatile memory device 120 may output the dumped data.

Here, it is necessary to define a time when the sensed data is output during execution of the core recovery operation. Although the ready/busy signal RnB is set to a high level, an external command should not be provided to the nonvolatile memory device 120 during a time section T3 to T4 when the core recovery operation of the nonvolatile memory device 120 is performed. In this case, although a command is provided from the memory controller 110 to the nonvolatile memory device 120, an abnormal operation may be generated since the core recovery operation is not completed. Thus, although a data output is ended, a command input may be prohibited during a time section tRC between a time when the ready/busy signal RnB is set to a high level and a time when the core recovery operation is completed. Hereinafter, the time section tRC may be referred to as a command wait time. At an access operation of the nonvolatile memory device 120, the memory controller 110 may issue a next command for a read, program, and erase operation after the command wait time tRC elapses.

Figure 5:
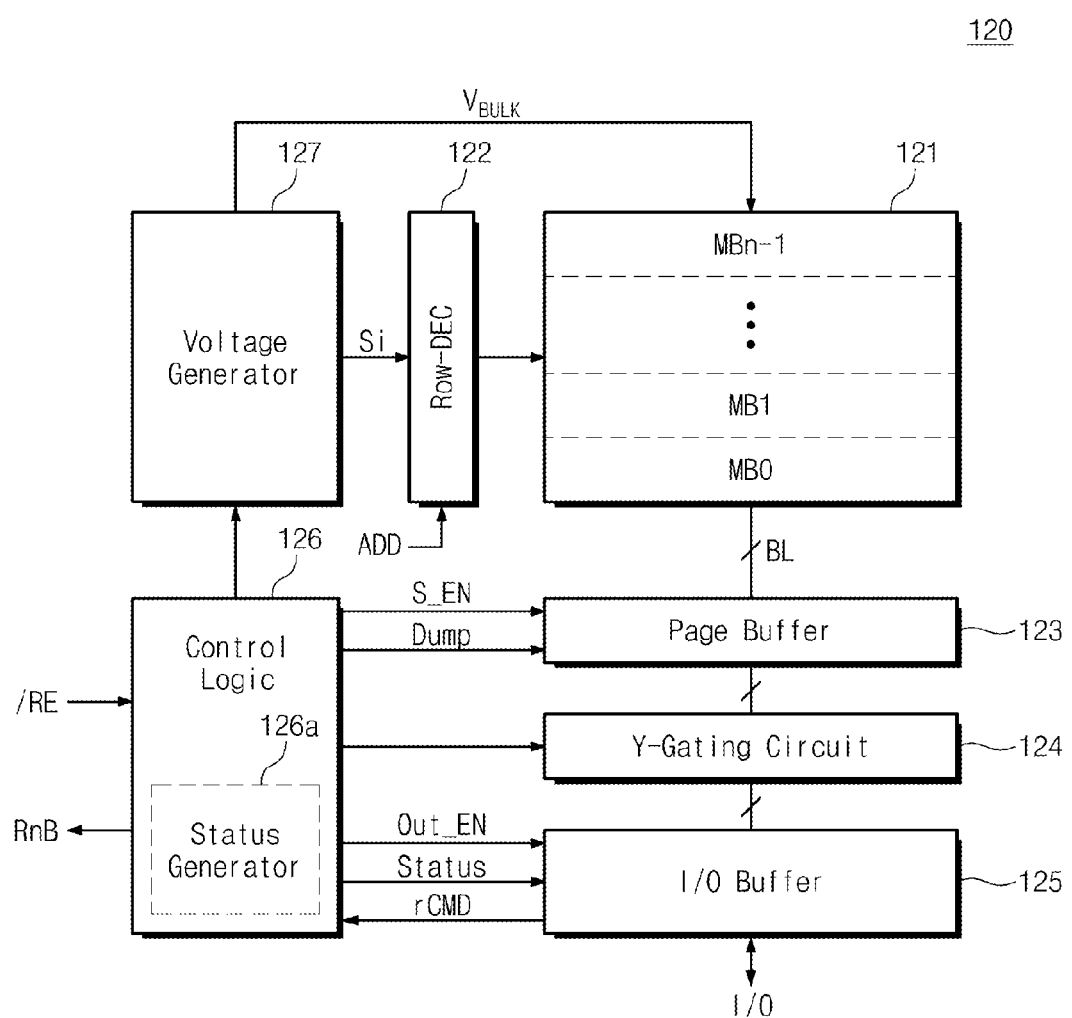
FIG. 5 is a block diagram schematically illustrating a nonvolatile memory device according to an embodiment of the inventive concept.

FIG. 5 is a block diagram schematically illustrating a nonvolatile memory device according to an embodiment of the inventive concept. Referring to FIG. 5, a nonvolatile memory device 120 may include a cell array 121, a row decoder 122, a page buffer 123, a column gating circuit 124, an input/output buffer 125, control logic 126, and a voltage generator 127.

The cell array 121 may be connected with the row decoder 122 through word lines and selection lines. The cell array 121 may be connected with the page buffer 123 through bit lines BL. The cell array 121 may include a plurality of NAND cell strings, each of which forms a vertical or horizontal channel. The word lines of the cell array 121 may be stacked in a vertical direction.

At a read operation, the cell array 121 may be provided with a word line voltage and a selection line voltage from the row decoder 122. The bit lines of the cell array 121 may be provided with a pre-charge voltage from the page buffer 123. Also, during the read operation, a well or a common source line of the cell array 121 may be provided with a voltage from the voltage generator 127. Further, during the read operation, various core voltages may be applied to selected memory cells and peripheral circuits.

The row decoder 122 may select one of memory blocks of the cell array 121 in response to an address ADD. The row decoder 122 may select one of word lines of the selected memory block. The row decoder 122 may provide the word line voltage and the selection line voltage to the selected memory block. At a read operation, the row decoder 122 may transfer a selection read voltage to a selected word line and a non-selection read voltage to an unselected word line.

The page buffer 123 may act as a write driver or a sense amplifier according to a mode of operation. At a read operation, the page buffer 123 may sense data of selected memory cells through bit lines according to a control of the control logic 126. The page buffer 123 may pre-charge bit lines of selected memory cells according to a control of the control logic 126. The page buffer 123 may sense bit lines or sensing nodes of the selected memory cells in response to a sensing enable signals S_EN from the control logic 126. The sensed data may be stored in latches of the page buffer 123. Also, the page buffer 123 may dump the latched data to the input/output buffer 125 through the column gating circuit 124 in response to a dump signal Dump from the control logic 126.

The column gating circuit 124 may sequentially select read data stored at the latch (e.g., a cache latch) of the page buffer 124 according to a control of the control logic 126.

The input/output buffer 125 may temporarily store data provided from an external device. The input/output buffer 125 may temporarily store read data or internal status data of the nonvolatile memory device 120 to output it to the external device through input/output lines at an appointed point of time. For example, the input/output buffer 125 may temporarily store a command, an address, and data provided through input/output lines from the external device. A command rCMD may be provided to the control logic 126, an address to the row decoder 122 or the control logic 126, and data to the page buffer 123.

Status data provided from the control logic 126 may be temporarily stored, and the temporarily stored status data may be output to the external device through the input/output lines. The input/output buffer 125 may output read data dumped from the page buffer 123 in response to an output enable signal Out_EN from the control logic 126.

The control logic 126 may control the page buffer 123, the column gating circuit 124, the input/output buffer 125, and the voltage generator 127 in response to the command rCMD or a control signal from the external device. The control logic 126 may perform an overall control operation including a word line setup operation, a data sensing operation, a dumping operation, and a core recovery operation on selected memory cells in response to a read command. At a read operation, the control logic 126 may output a ready/busy signal RnB having a low-to-high transition soon after the dumping operation is completed. At this time, when a status command is received from the external device, the control logic 126 may control the input/output buffer 125 to output a ready state.

The control logic 126 may include a status generator 126a to output a high level of ready/busy signal RnB during execution of the core recovery operation. After the read command rCMD is provided, the status generator 126a may generate the ready/busy signal RnB and/or status data based on whether data of selected memory cells is sensed and whether dumping of the sensed data is completed. The status generator 126a may generate the ready/busy signal RnB and status data regardless of whether the core recovery operation of the nonvolatile memory device 120 is completed. That is, if dumping of the sensed data is completed during execution of the core recovery operation, the status generator 126a may set the ready/busy signal RnB to a high level and the status data to a ready state.

The voltage generator 127 may generate word line voltages to be supplied to word lines according to a control of the control logic 126. Also, under a control of the control logic 126, the voltage generator 127 may generate a voltage to be supplied to a bulk (or, a well area) where memory cells are formed. The word line voltages to be supplied to word lines may include a program voltage, a pass voltage, selection and non-selection read voltages, and so on. The voltage generator 127 may also generate selection line voltages to be provided to selection lines SSL and GSL at read and program operations.

The nonvolatile memory device 120 of the inventive concept may output data to an external device in response to a read command. In particular, the nonvolatile memory device 120 may output data before a core recovery operation following a dumping operation is completed. Thus, an input of a next command may be prohibited during a time when the core recovery operation is performed. A time when a command input is prohibited.

Figure 6:
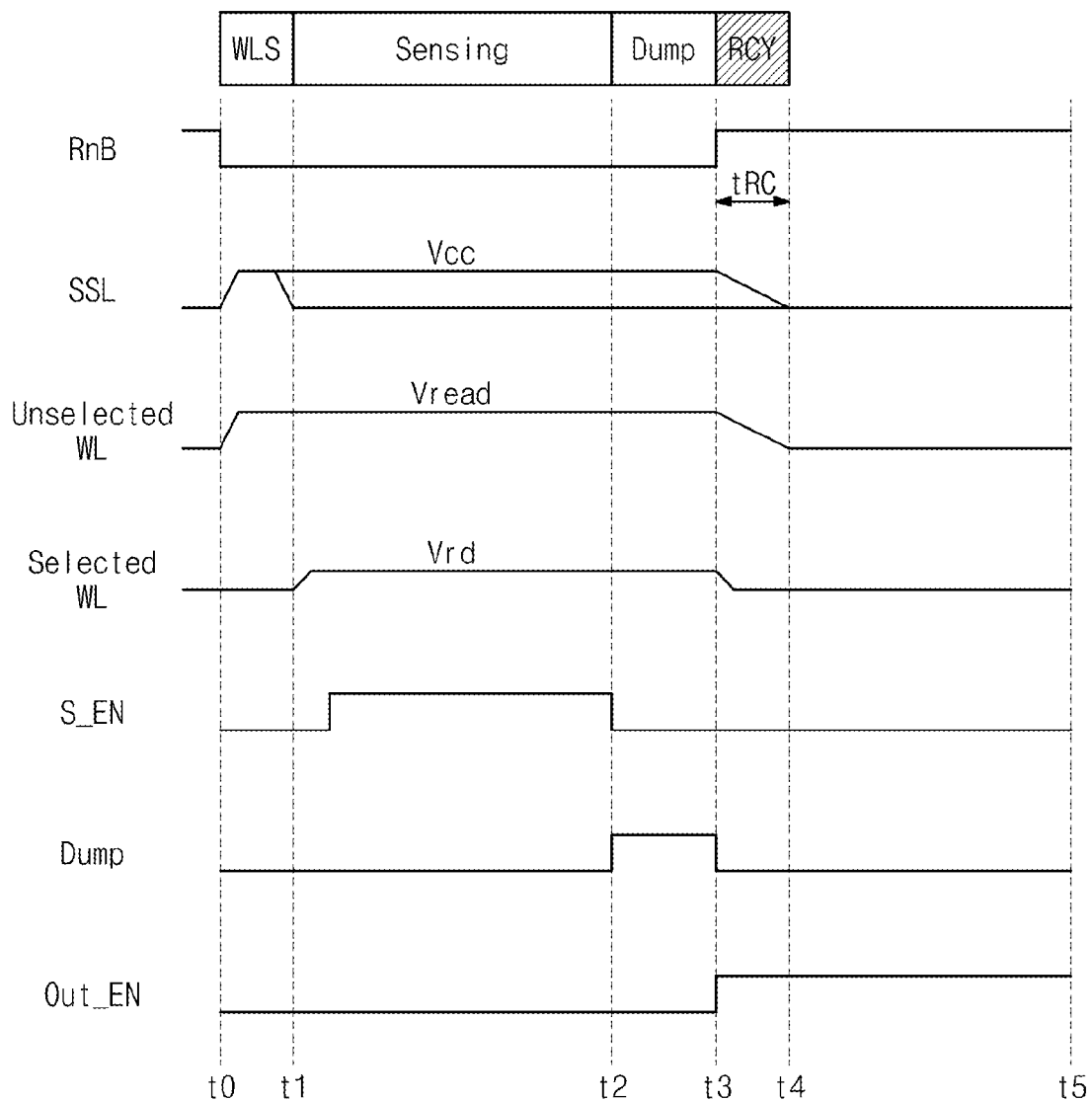
FIG. 6 is a timing diagram schematically illustrating an example of a read operation of the nonvolatile memory device of FIG. 5.

FIG. 6 is a timing diagram schematically illustrating an example of a read operation of the nonvolatile memory device of FIG. 5. Referring to FIG. 6, a nonvolatile memory device 120 may sequentially perform a word line setup operation, a sensing operation, a dump operation, and a core recovery operation in response to a read command (e.g., 00h-ADD-30h).

When the read command is received during a high-level interval of a ready/busy signal RnB, the nonvolatile memory device 120 may set the ready/busy signal RnB to a low level and start an overall procedure for sensing selected memory cells.

At t0, the nonvolatile memory device 120 may perform the word line setup operation. A high level of string selection signal may be applied to a string selection line SSL of a selected memory block in the nonvolatile memory device 120, and a non-selection read voltage Vread may be applied to an unselected word line.

At t1, the nonvolatile memory device 120 may sense the selected memory cells. To sense the selected memory cells, a selection read voltage Vrd may be applied to a selected word line. Although not shown, bit lines of memory cells may be pre-charged with a specific level for a sensing operation. Under this condition, in response to a sensing enable signal S_EN from control logic 126, a page buffer 123 may sense bit lines or sensing nodes supplied with bit line pre-charge voltages. That is, the page buffer 123 may store sensing data at a latch therein according to levels of the sensing nodes.

At t2, the control logic 126 may provide a dump signal Dump to the page buffer 123. In response to the dump signal, the page buffer 123 may output sensing data of the latch to an input/output buffer 125. The sensing data output from the page buffer 123 may be stored at a latch unit of the input/output buffer 125. This dumping operation may be performed until t3.

At t3, the control logic 126 may control the cell array 121, the row decoder 122, the page buffer 123, the voltage generator 127, etc. to discharge all voltages or currents provided for a read operation. That is, a core recovery operation may be performed at t3 to recover a bias state of the cell array 121 to a state before the read operation. In addition, the control logic 126 may set the ready/busy signal RnB to a high level at t3 when the dumping operation is completed. Alternatively, or in addition, if a status read command is received within such an interval, the control logic 126 may output a ready state. An output enable signal Out_EN of read data stored at the input/output buffer 125 may be activated at a point of time when the ready/busy signal RnB has a low-to-high transition.

During a command wait time tRC when the ready/busy signal RnB has a high level, the nonvolatile memory device 120 may perform the core recovery operation. For example, at the core recovery operation, a power supply voltage of the string selection line SSL may be discharged to a ground voltage (e.g., 0V), and word line voltages applied to the selected and unselected word lines may be discharged to a ground voltage. The command wait time tRC may be decided in consideration of start and end points of time of the core recovery operation. During the command wait time tRC, as described above, a command input may be prohibited after the ready/busy signal RnB transitions to a high level.

Voltage waveforms of lines WL, SSL, and BL at the core recovery operation (e.g., at a time section t3 to t4) are not limited to the examples shown in FIG. 6. That is, the voltage waveforms of FIG. 6 are exemplary only. Various modifications and changes to the voltage waveforms of lines WL, SSL, and BL at the core recovery operation (e.g., at a time section t3 to t4) can be made.

Figure 7:
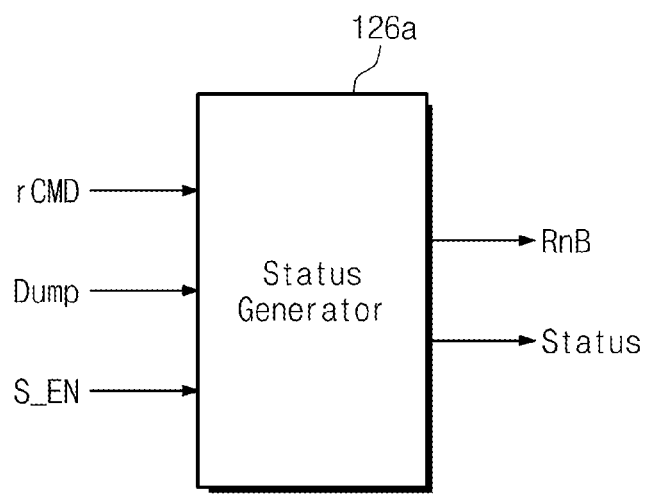
FIG. 7 is a block diagram schematically illustrating an example of a status generator of the nonvolatile memory device of FIG. 5.

FIG. 7 is a block diagram schematically illustrating a status generator of FIG. 5. Referring to FIG. 7, a status generator 126a may generate a ready/busy signal RnB or status data Status in response to a read command rCMD, a dump signal Dump, and a sensing enable signal S_EN.

The status generator 126a may decide a level of the ready/busy signal RnB of the inventive concept following an input of the read command rCMD. The status generator 126a may output the ready/busy signal RnB having a high-to-low transition after the read command rCMD is received. During a low level of the ready/busy signal RnB, a nonvolatile memory device 120 may perform a word line setup operation, a sensing operation, and a dump operation. The sensing enable signal S_EN may be activated when the word line setup operation is completed. The dump signal Dump may be activated when the sensing operation activated by the sensing enable signal S_EN is ended. The status generator 126a may output the ready/busy signal RnB having a low-to-high transition at a point of time when the dump operation is completed. The status data may be output as a ready state from this point of time.

Figure 8:
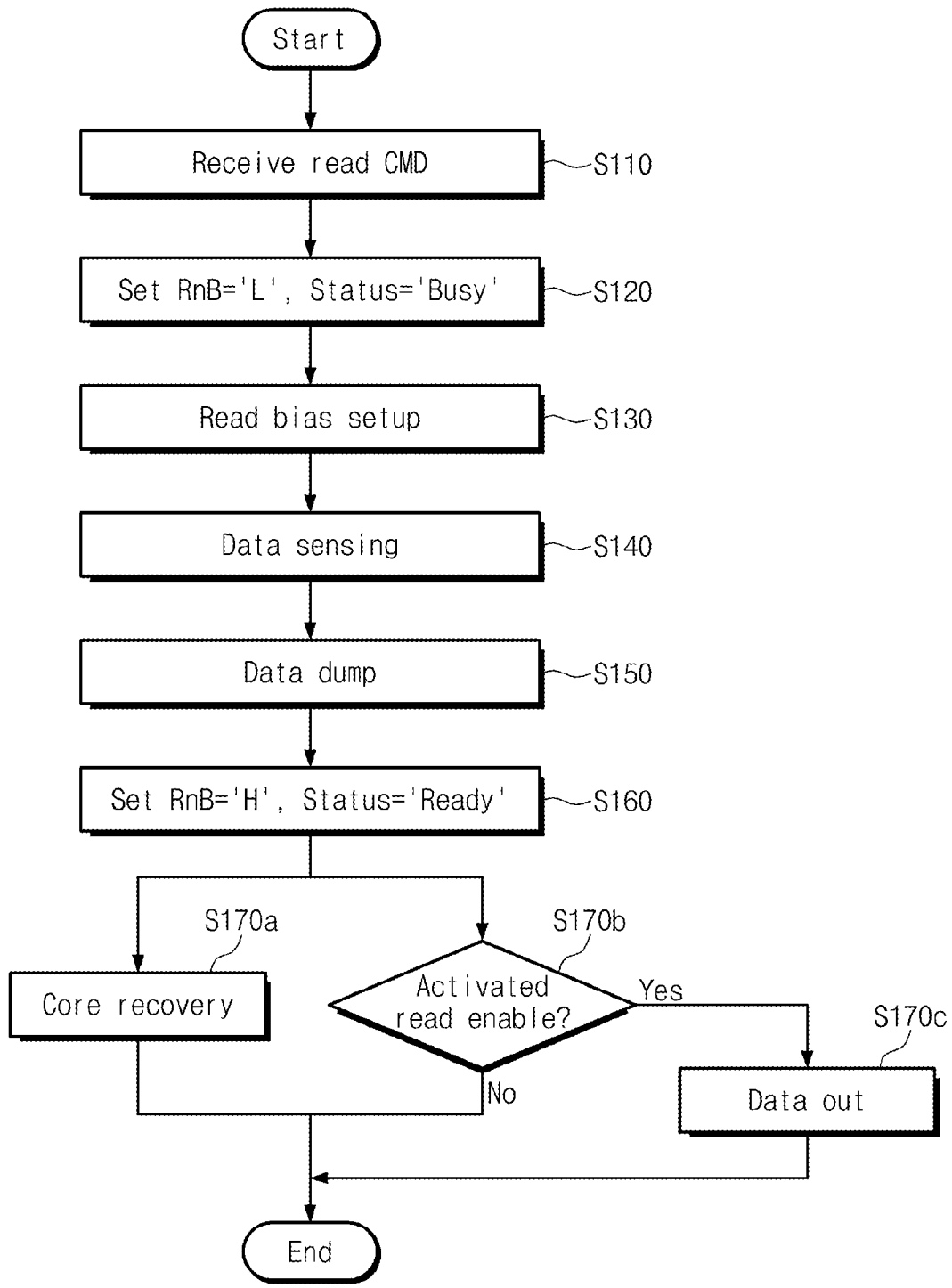
FIG. 8 is a flow chart for reference in describing an operation of a nonvolatile memory device according to an embodiment of the inventive concept.

FIG. 8 is a flow chart for reference in describing an example of an operation of a nonvolatile memory device according to an embodiment of the inventive concept. As will be explained with reference to FIG. 8, a nonvolatile memory device 120 (refer to FIG. 5) may output data before a core recovery operation is ended at a read operation.

In operation S110, the nonvolatile memory device 120 may receive a read command through an input/output buffer 125. The read command rCMD may be provided using a read command sequence (e.g., 00h-ADD-30h) transferred from a memory controller 110 to the input/output buffer 125 through input/output lines. The read command rCMD temporarily latched by the input/output buffer 125 may be transferred to control logic 126. An address temporarily latched by the input/output buffer 125 may be transferred to the control logic 126 or a row decoder 122.

In operation S120, the nonvolatile memory device 120 may set a ready/busy signal RnB to a low level in response to the read command rCMD. A status generator 126a of the control logic 126 may set a logic value of a register for setting the ready/busy signal RnB to "0" in response to the read command rCMD. Also, the status generator 126a of the control logic 126 may set a value of a status register to be output to the input/output lines to a "Ready" status in response to the read command rCMD.

In operation S130, the nonvolatile memory device 120 may set up a read bias for a read operation. For example, the control logic 126 may control the row decoder 122, a page buffer 123, and a voltage generator 127 to generate a word line voltage, a selection line voltage, a bulk voltage, a bit line voltage, etc. for a read operation. All voltages thus generated may be referred to as a read bias voltage. If the read bias voltage is generated, the control logic 126 may provide the generated voltages to a bit line, a word line, and a selection line.

In operation S140, the nonvolatile memory device 120 may sense voltage variations of bit lines connected to selected memory cells. For example, the page buffer 123 may precharge bit lines connected to selected memory cells and transfer voltages of the bit lines pre-charged to sensing nodes SO. The page buffer 123 may determines logic levels of the sensing nodes SO to store a sensing result at sensing latches provided for a sensing operation. Afterwards, sensing data stored at the sensing latches of the page buffers 123 may be transferred to cache latches of the page buffer 123 to perform a dump operation.

In operation S150, the nonvolatile memory device 120 may perform a dump operation to transfer the sensed data latched by the page buffer 123 to the input/output buffer 125. The control logic 126 may activate a dump signal Dump such that data stored at the cache latches of the page buffer 123 is dumped to output latches of the input/output buffer 125. At the dump operation, the control logic 126 may control a column gating circuit 124 such that the sensed data is transferred from the page buffer 123 to the input/output buffer 125 by an input/output unit.

In operation S160, if the dump operation is ended, the nonvolatile memory device 120 may set the ready/busy signal RnB to a high level. If the dump operation is ended, a status generator 126a of the control logic 126 may set a logic value of a register for setting the ready/busy signal RnB to "1" regardless of whether a core recovery operation is completed. Also, in response to a status read command, the status generator 126a may change a value of a status register to be output to input/output lines from a "Busy" status to a "Ready" status.

In operations S170a, S170b, and S170c, the nonvolatile memory device 120 may perform the core recovery operation and an output of the sensed data at the same time. In other words, the output of the sense data may be executed at least partially in parallel with the execution of the core recovery operation. If the dump operation is ended, in operation S170a, the core recovery operation may be performed at the same time when the ready/busy signal RnB transitions from a low level to a high level. The sensed data dumped to the input/output buffer 125 may be output independently from the core recovery operation (S170a). In operation S170b, the control logic 126 may detect whether a read enable signal /RE is provided from the memory controller 110. If the read enable signal /RE is not provided during a predetermined time, the method may be ended. If the read enable signal /RE is provided, the control logic 126 may activate an output enable signal Out_EN such that the sensed data temporarily stored at the input/output buffer 125 is output to the external device.

A read operation of the nonvolatile memory device 120 of the inventive concept is described. The nonvolatile memory device 120 may sense a selected memory area in response to a read command. The nonvolatile memory device 120 may output sensed data by setting a ready/busy signal RnB to a high level before a core recovery operation following a sensing operation is completed. Thus, as the sensed data is output during execution of the core recovery operation, a high-speed read operation may be implemented.

Figure 9:
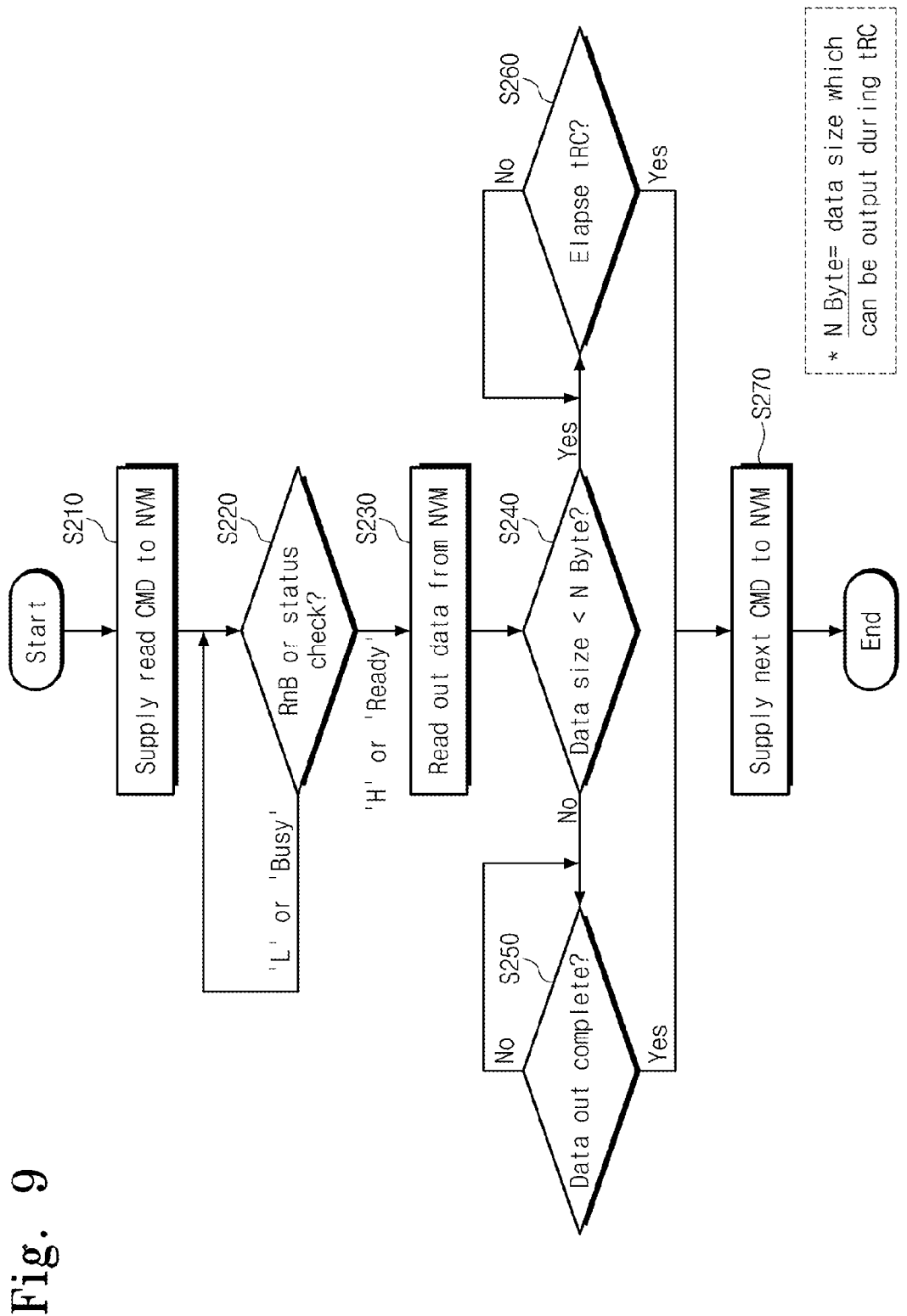
FIG. 9 is a flow chart for reference in describing an operational example associated with the nonvolatile memory device of FIG. 5.

FIG. 9 is a flow chart for reference in describing an example of a control method of a nonvolatile memory device of FIG. 5. Referring to FIG. 9, a memory controller 110 (refer to FIG. 3) may not issue a next command during a command wait time tRC even though a ready/busy signal RnB of a nonvolatile memory device 120 transitions from a low level to a high level. This will be more fully described below.

In operation S210, the memory controller 110 may issue a command (e.g., a read command) to the nonvolatile memory device 120. The read command rCMD may be provided using a read command sequence (e.g., 00h-ADD-30h) to the nonvolatile memory device 120 through input/output lines of FIG. 4. However, the inventive concept is not limited thereto. For example, a command accompanying an operation of applying specific voltages to bit lines or word lines connected with memory cells of the nonvolatile memory device 120 may be provided in the same manner as the read command of the inventive concept.

In operation S220, the memory controller 110 may detect a ready/busy signal RnB to check an internal operation of the nonvolatile memory device 120 corresponding to the transferred command. Alternatively, the memory controller 110 may provide a status read command to check an internal operation of the nonvolatile memory device 120 corresponding to the transferred command. If the ready/busy signal RnB has a low level indicating a busy state or status data is output as "Busy", the memory controller may continue to check an internal operation of the nonvolatile memory device 120. If the ready/busy signal RnB has a high level indicating a ready state or status data is output as "Ready", the method may proceed to operation S230.

In operation S230, the memory controller 110 may fetch sensing data from the nonvolatile memory device 120. For example, the memory controller 110 may toggle a read enable signal /RE, and may fetch the sensing data output in synchronization with the read enable signal /RE.

In operation S240, the memory controller 110 may compare a size of the sensing data output from the nonvolatile memory device 120 with a reference size (e.g., N bytes). Here, the reference size may mean a size of data capable of being output during a command wait time tRC. If a size of data read requested by the memory controller 110 is equal to or more than the reference size, the method may proceed to operation S250. On the other hand, if a size of data read requested by the memory controller 110 is less than the reference size, the method may proceed to operation S260.

In operation S250, since a size of data read requested by the memory controller 110 is equal to or more than the reference size, the memory controller 110 may wait until a data output is completed. That is, that a size of data read requested by the memory controller 110 is equal to or more than the reference size may mean that the sensing data continues to be output even though the command wait time tRC elapses. Thus, the memory controller 110 may wait until a data output is completed. Here, the memory controller 110 may predict a wait time according to a size of data to be output. If a data output cycle is ended, the method may proceed to operation S270.

Since a size of data read requested by the memory controller 110 is less than the reference size, in operation S260, a data output may be completed before the command wait time tRC elapses. The memory controller 110 may check whether the command wait time tRC elapses, not whether a data output is ended. The memory controller 110 may wait when the command wait time tRC does not elapse. If the command wait time tRC elapses, the method may proceed to operation S270.

In operation S270, the memory controller 110 may issue a next command to the nonvolatile memory device 120. Since read requested data all is output or a command wait time tRC for executing the core recovery operation elapses, the reliability may not be lowered even though a command is issued.

FIG. 10 is a table schematically illustrating examples of minimum wait times according to sizes of data read requested by a memory controller of FIG. 9. Referring to FIG. 10, a minimum wait time may be varied according to a size of data read requested and a clock frequency of a memory controller 110. Here, it is assumed that a nonvolatile memory device 120 outputs data in the same speed regardless of a clock frequency of the memory controller 110.

For example, in the event that data read requested has a size of 4K bytes, a time taken to output the read requested data may be about 10 μs. If data read requested has a size of 8K bytes, a time taken to output the read requested data may be about 20 μs. A time of about 40 μs may be taken to output data of 16K bytes. Here, a command wait time tRC may have a fixed value at a point of time after a ready/busy signal RnB transitions from a low level to a high level. The command wait time tRC may be longer or shorter than a time taken to output data.

Figure 11:
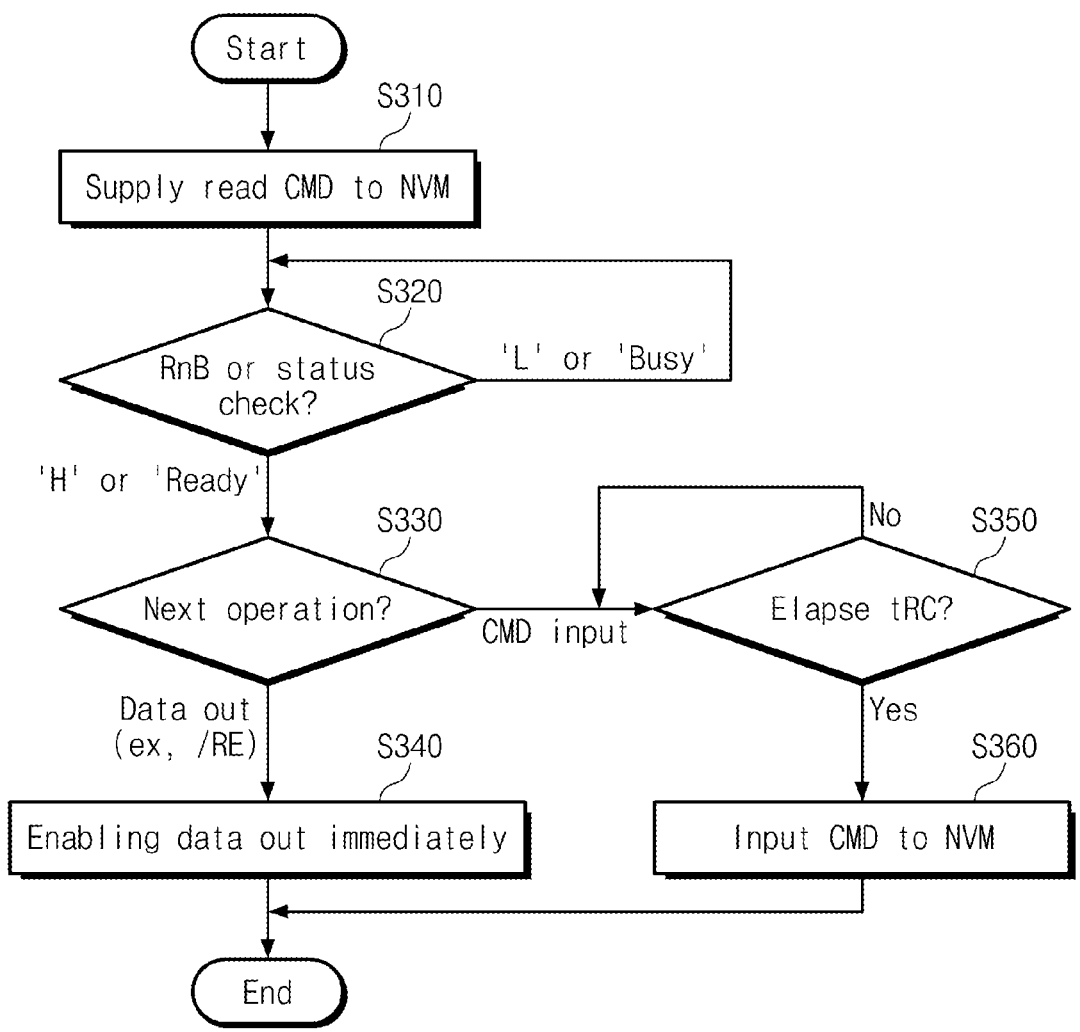
FIG. 11 is a flow chart for reference in describing a control method of the nonvolatile memory device of FIG. 5 according to another embodiment of the inventive concept.

FIG. 11 is a flow chart for reference in describing an example of a control method of a nonvolatile memory device of FIG. 5 according to another embodiment of the inventive concept. As will be described below with reference to FIG. 11, although a ready/busy signal RnB transitions from a low level to a high level at a read operation, a memory controller 110 (refer to FIG. 3) may not issue a next command during a command wait time tRC.

In operation S310, the memory controller 110 may issue a command (e.g., a read command) to a nonvolatile memory device 120. The read command may be provided to the nonvolatile memory device 120 through input/output lines of FIG. 4 using a read command sequence (e.g., 00h-ADD-30h). However, the inventive concept is not limited thereto. For example, a command accompanying an operation of applying specific voltages to bit lines or word lines connected with memory cells of the nonvolatile memory device 120 may be provided in the same manner as the read command of the inventive concept.

In operation S320, the memory controller 110 may detect a ready/busy signal RnB to check an internal operation of the nonvolatile memory device 120 corresponding to the transferred command. Alternatively, the memory controller 110 may provide a status read command to check an internal operation of the nonvolatile memory device 120 corresponding to the transferred command. If the ready/busy signal RnB has a low level indicating a busy state or status data is output as "Busy", the memory controller may continue to check an internal operation of the nonvolatile memory device 120. If the ready/busy signal RnB has a high level indicating a ready state or status data is output as "Ready", the method may proceed to operation S330.

In operation S330, the memory controller 110 may decide a next operation of the nonvolatile memory device 120. For example, the memory controller 110 may control the nonvolatile memory device 120 to output sensed data. In this case, the method may proceed to operation S340. On the other hand, in the event that issuance of a command more urgent than an output of the sensed data is required after the memory controller 110 issues a read command, the method may proceed to operation S350.

In operation S340, the memory controller may toggle a read enable signal /RE, and may fetch the sensing data output in synchronization with the read enable signal /RE.

In operation S350, the memory controller 110 may wait until a command wait time tRC for an input of a next command elapses. If the command wait time tRC does not elapse, the memory controller 110 may wait until a counted time reaches the command wait time tRC. If the command wait time tRC elapses, the memory controller 110 may issue a next command to the nonvolatile memory device 120.

There is described a method of applying a command wait time tRC when a next command must be issued without a data output operation after a read command is provided.

Figure 12:
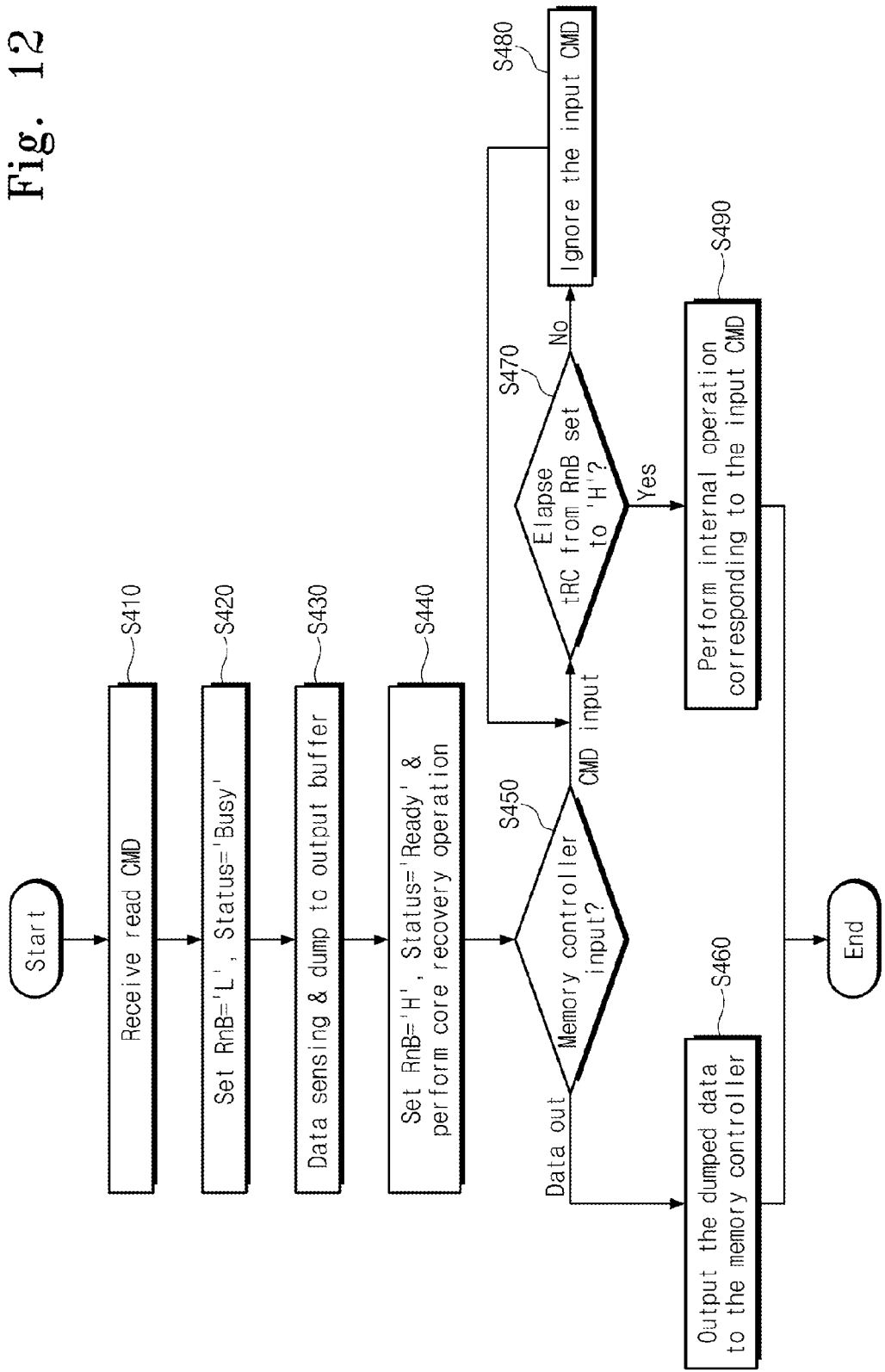
FIG. 12 is a flow chart for reference in describing an operation of a nonvolatile memory device according to another embodiment of the inventive concept.

FIG. 12 is a flow chart for reference in describing an operational example of a nonvolatile memory device according to an embodiment of the inventive concept. Referring to FIG. 12, a nonvolatile memory device 120 (refer to FIG. 5) may ignore a command provided before a command wait time tRC.

In operation S410, the nonvolatile memory device 120 may receive a read command through an input/output buffer 125.

In operation S420, the nonvolatile memory device 120 may set a ready/busy signal RnB to a low level in response to the read command rCMD. A status generator 126a of control logic 126 may set to a logic value of a register for setting the ready/busy signal RnB to "0" in response to the read command rCMD. Also, the status register 126a may change a value of a status register to be output to the input/output lines from a "Ready" status to a "Busy" status.

In operation S430, the nonvolatile memory device 120 may generate a read bias for a read operation and sense selected memory cells based on the read bias generated. The nonvolatile memory device 120 may sense voltage variations of bit lines connected to the selected memory cells. The nonvolatile memory device 120 may store the sensed data at sensing latches of a page buffer 123. The sensed data stored at the sensing latches of the page buffer 123 may be transferred to cache latches thereof for a dump operation. The sensed data stored at the cache latches may be dumped to an input/output buffer 125 later.

In operation S440, if the dump operation is completed, the nonvolatile memory device 120 may set the ready/busy signal RnB to a high level. If the dump operation is completed, the status generator 126a may set a logic value of a register for setting the ready/busy signal RnB to "1" regardless of a core recovery operation is ended. Also, the status register 126a may change a value of a status register to be output to the input/output lines from a "Busy" status to a "Ready" status. In addition, if the dump operation is completed, the nonvolatile memory device 120 may perform the core recovery operation.

In operation S450, the nonvolatile memory device 120 may detect a control operation of the memory controller 110 while performing the core recovery operation. For example, the nonvolatile memory device 120 may determine whether the memory controller 110 activates a control signal (e.g., a read enable signal /RE) for an output of the dumped data or whether the memory controller 110 issues another command. In the event that the read enable signal /RE is activated, the method may proceed to operation S460. On the other hand, in the event that another command is received without a data output, the method may proceed to operation S470.

In operation S460, the nonvolatile memory device 120 may output the sensed data to the memory controller 110.

In operation S470, the nonvolatile memory device 120 may determine whether the command wait time tRC elapses, based on a point of time when the ready/busy signal RnB transitions from a low level to a high level. If the command wait time tRC does not elapse, the method may proceed to operation S480, in which an input command is ignored. Afterwards, the method may proceed to operation S470, in which whether the command wait time tRC elapses is continuously detected. If command wait time tRC elapses, the method may proceed to operation S490, in which an input command is executed. In operation S490, the nonvolatile memory device 120 may perform an internal operation corresponding to the input command.

Figure 13:
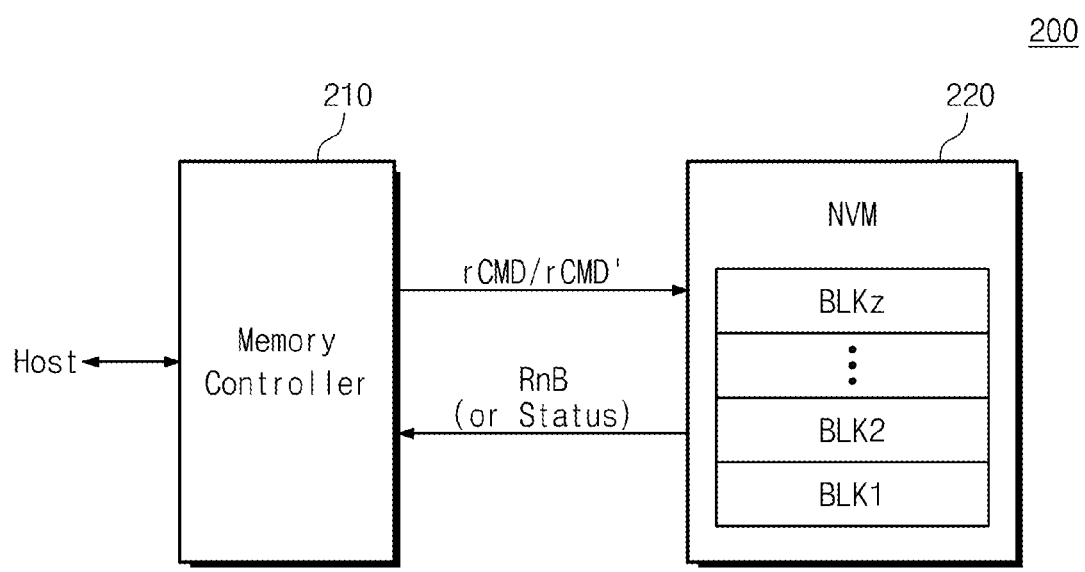
FIG. 13 is a block diagram schematically illustrating a memory system according to another embodiment of the inventive concept.

FIG. 13 is a block diagram schematically illustrating a memory system according to another embodiment of the inventive concept. Referring to FIG. 13, a memory system 200 may include a controller 210 and a nonvolatile memory device 220.

The memory controller 210 may issue first and second read commands rCMD and rCMD' to the nonvolatile memory device 220. In response to the first read command rCMD, the nonvolatile memory device 220 may set a ready/busy signal RnB to a high level after a core recovery operation is ended. Thus, at a read operation corresponding to the first read command rCMD, sensed data may be output after a core recovery operation is completed.

In response to the second read command rCMD', the nonvolatile memory device 220 may set the ready/busy signal RnB to a high level when a dump operation of sensed data is ended, regardless of the core recovery operation is completed. Thus, the nonvolatile memory device 220 may output the sensed data during execution of the core recovery operation.

With the above description, the memory system 200 may perform a core recovery operation and a data output operation simultaneously or separately, based on a read command type. When the second read command rCMD' is provided to the nonvolatile memory device 220, the memory controller 210 may not issue a next command during a predetermined time although the ready/busy signal RnB is set to a high level or status data indicates "Ready".

Figure 14:
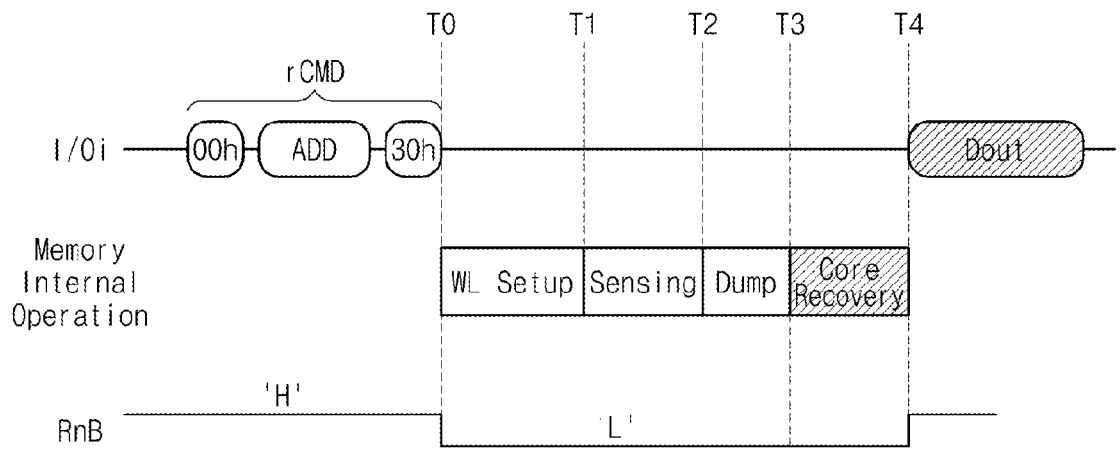
FIG. 14 is a timing diagram schematically illustrating an example of a response of a nonvolatile memory device to a first read command.

FIG. 14 is a timing diagram schematically illustrating an example of a response of a nonvolatile memory device to a first read command. Referring to FIG. 14, a memory controller 210 may control a nonvolatile memory device 220 such that a data output is possible after a core recovery operation is completed.

During a high section of a ready/busy signal RnB, the memory controller 210 may provide a read command sequence 00h-ADD-30h to the nonvolatile memory device 220. Here, the read command sequence 00h-ADD-30h may correspond to a first read command rCMD. The nonvolatile memory device 220 may set a ready/busy signal RnB to a low level in response to the first read command rCMD. Alternatively or in addition, if a status read command is received, the nonvolatile memory device 220 may output data indicative of a busy state.

During a word line setup section T0 to T1, the nonvolatile memory device 220 may respond to the first read command rCMD to generate a word line voltage to be provided to a selected memory area. During a sensing section T1 to T2, the nonvolatile memory device 220 may sense and latch cells of the selected memory area. During a dump section T2 to T3, the sensed data may be dumped to an output buffer. During a core recovery section T3 to T4 following the dump section, the nonvolatile memory device 220 may perform a core recovery operation to discharge a bulk, word lines, bit lines, selection lines, a common source line, etc. associated with the selected memory cells.

After the core recovery operation is ended, the nonvolatile memory device 220 may set the ready/busy signal RnB to a high level. A data output may be possible from a point of time when the ready/busy signal RnB transitions from a low level to a high level. As the memory controller 210 activates a read enable signal /RE based on the ready/busy signal RnB, the nonvolatile memory device 220 may output the dumped data.

There is described a read mode where a data output is possible after a core recovery operation is ended in response to the first read command rCMD.

Figure 15:
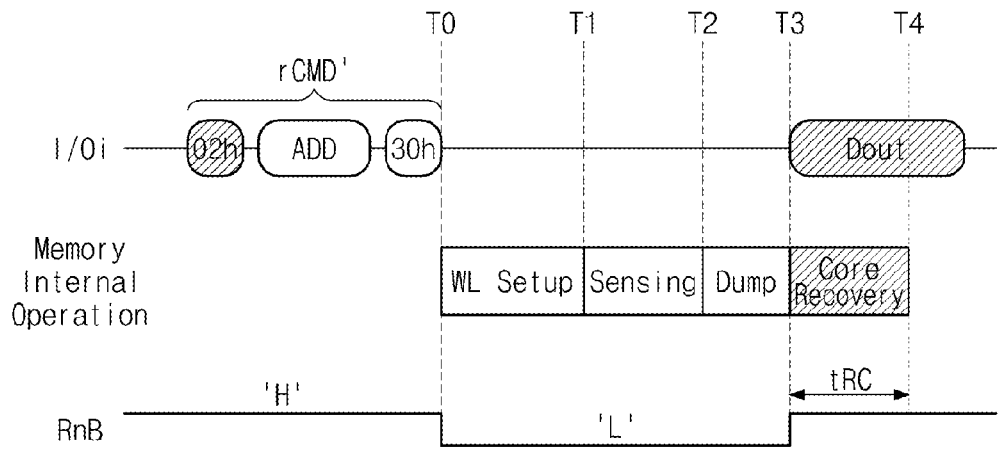
FIG. 15 is a timing diagram schematically illustrating an example of a response of a nonvolatile memory device to a second read command.

FIG. 15 is a timing diagram schematically illustrating a response of a nonvolatile memory device to a second read command. Referring to FIG. 15, a memory controller 210 may fetch data from a nonvolatile memory device 220 even though a core recovery operation corresponding to a second read command rCMD' is not completed.

During a high section of a ready/busy signal RnB, the memory controller 210 may provide a read command sequence 02h-ADD-30h to the nonvolatile memory device 220. Here, the read command sequence 02h-ADD-30h may correspond to a second read command rCMD'. The nonvolatile memory device 220 may set a ready/busy signal RnB to a low level in response to the second read command rCMD'.

During a word line setup section T0 to T1, the nonvolatile memory device 220 may respond to the first read command rCMD to generate a word line voltage to be provided to a selected memory area. During a sensing section T1 to T2, the nonvolatile memory device 220 may sense and latch cells of the selected memory area. During a dump section T2 to T3, the sensed data may be dumped to an output buffer. The ready/busy signal RnB may transition from a low level to a high level when the dump operation is ended. During a core recovery section T3 to T4, the nonvolatile memory device 220 may perform a core recovery operation to discharge a bulk, word lines, bit lines, selection lines, a common source line, etc. associated with the selected memory cells.

At a read operation corresponding to the second read command rCMD', if a sensed data dumping operation is ended during the dump section T2 to T3, the ready/busy signal RnB may transition from a low level to a high level. An output of the sensed data dumped may be possible from a point of time when the ready/busy signal RnB transitions from a low level to a high level. At this time, if the memory controller 210 activates a read enable signal /RE, the dumped data may be output from the nonvolatile memory device 220.

A read mode where the second read command rCMD' is provided, sensed data may be output while a core recovery operation of the nonvolatile memory device 220 is performed. Although the ready/busy signal RnB has a high level, an issue of a next command to the nonvolatile memory device 220 may be prohibited during a command wait time tRC when a core recovery operation is performed. In the event that the second read command rCMD' is received, an input of a next command may be prohibited during a command wait time tRC although the ready/busy signal RnB has a high level.

In FIGS. 14 and 15, there is described a control method of a nonvolatile memory device where a core recovery operation and a data output operation are performed simultaneously or separately depending on the type of read command that is received.

Figure 16:
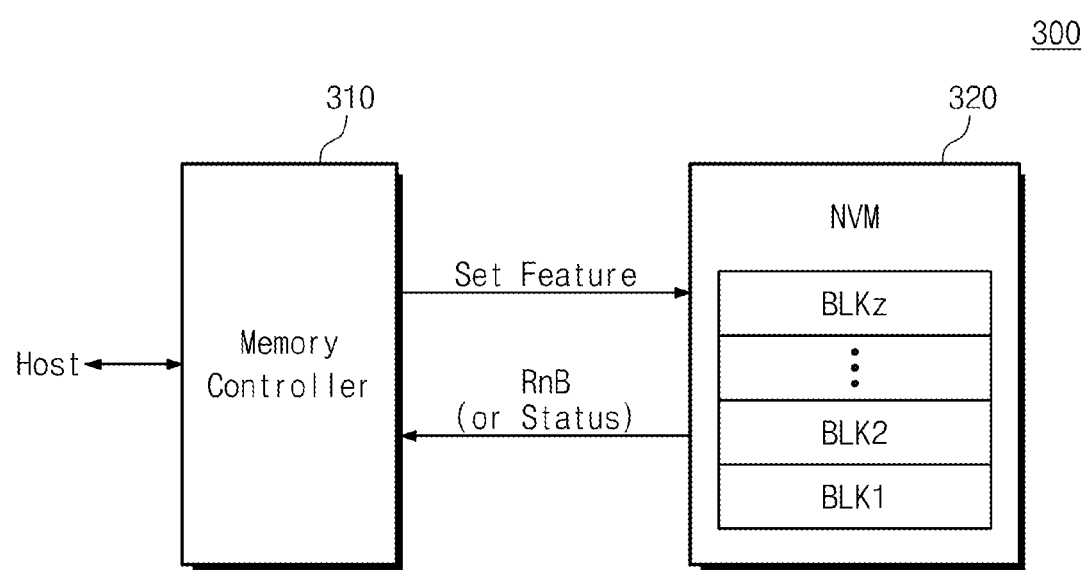
FIG. 16 is a block diagram schematically illustrating a memory system according to still another embodiment of the inventive concept.

FIG. 16 is a block diagram schematically illustrating a memory system according to still another embodiment of the inventive concept. Referring to FIG. 16, a memory system 300 may include a memory controller 310 and a nonvolatile memory device 320. The memory controller 310 may set a read mode of the nonvolatile memory device 320 using a set feature command.

The memory controller 310 may set a set feature of the nonvolatile memory device 320 to set a read mode. A set feature of the nonvolatile memory device 320 may be set such that a core recovery operation and a data output operation are performed simultaneously or separately at a read operation of the nonvolatile memory device 320. In the event that a set feature of the nonvolatile memory device 320 is set such that a core recovery operation and a data output operation are performed simultaneously, an input of a next command to the nonvolatile memory device 320 may be prohibited during a command wait time tRC although a ready/busy signal RnB has a high level at a read operation.

Figure 17:
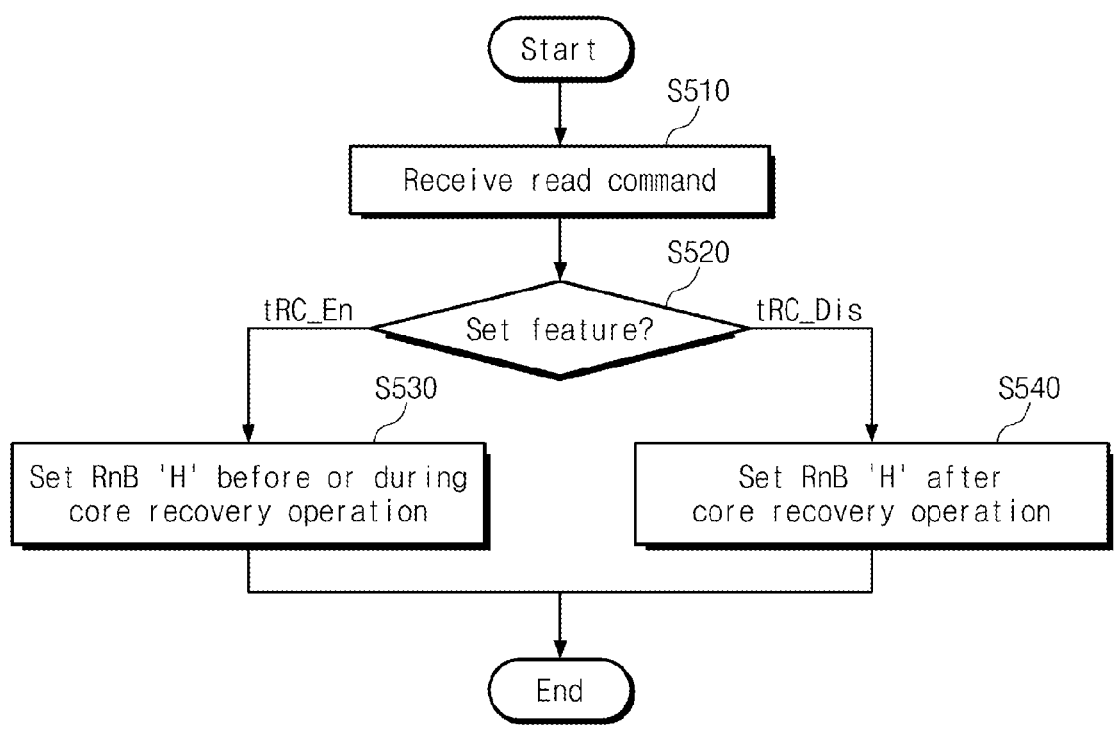
FIG. 17 is a flow chart for reference in describing an operational example of the memory system of FIG. 16.

FIG. 17 is a flow chart for reference in describing an operational example of a memory system of FIG. 16. As will be explained with reference to FIG. 17, a nonvolatile memory device 320 (refer to FIG. 16) may refer to a set feature to perform a read operation under the control of a memory controller 310. Here, it is assumed that a read mode of the nonvolatile memory device 320 is previously set by a set featured command.

In operation S510, the nonvolatile memory device 320 may receive a read command from a memory controller 310. A read command sequence provided to the nonvolatile memory device 320 may not include information for selecting a read mode.

In operation S520, the nonvolatile memory device 320 may check a previously decided read mode to execute the received read command. The nonvolatile memory device 320 may check whether the previously decided read mode corresponds to a first read mode tRC_En or to a second read mode tRC_Dis. If the previously decided read mode corresponds to the first read mode tRC_En, the method may proceed to operation S530. On the other hand, if the previously decided read mode corresponds to the second read mode tRC_Dis, the method may proceed to operation S540.

In operation S530, the nonvolatile memory device 320 may sense a read requested memory area according to the first read mode tRC_En, and may output the sensed data. The first read mode may correspond to a read mode where there is activated a command wait time tRC when a data output operation and a core recovery operation are performed at the same time.

In operation S540, the nonvolatile memory device 320 may sense a read requested memory area according to the second read mode tRC_Dis, and may output the sensed data. The second read mode may correspond to a read mode where there is inactivated a command wait time tRC when a data output operation and a core recovery operation are performed separately.

Figure 18:
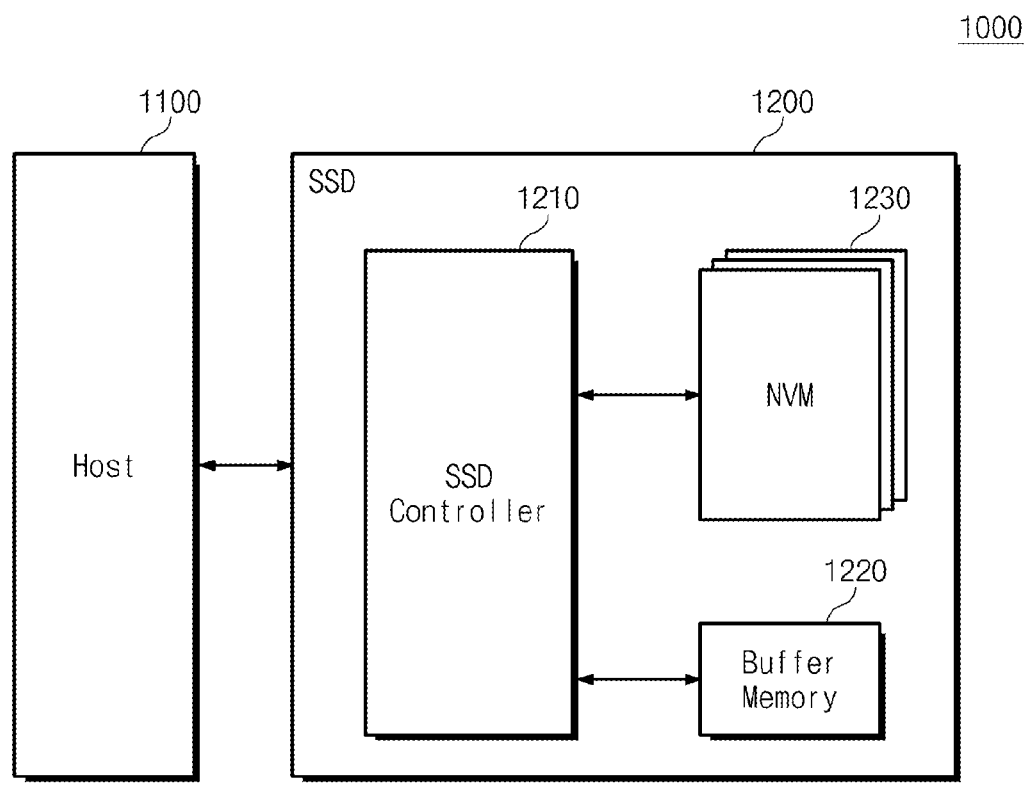
FIG. 18 is a block diagram illustrating a user device including a solid state drive according to an embodiment of the inventive concept.

FIG. 18 is a block diagram illustrating a user device including a solid state drive according to an embodiment of the inventive concept. Referring to FIG. 18, a user device 1000 may include a host 1100 and a solid state drive (hereinafter, referred to as SSD) 1200. The SSD 1200 may include an SSD controller 1210, a buffer memory 1220, and a nonvolatile memory device 1230.

The SSD controller 1210 may provide physical interconnection between the host 1100 and the SSD 1200. The SSD controller 1210 may provide an interface with the SSD 1200 corresponding to a bus format of the host 1100. In particular, the SSD controller 1210 may decode a command provided from the host 1100 to access the nonvolatile memory device 1230 based on the decoding result. The bus format of the host 1100 may include USB (Universal Serial Bus), SCSI (Small Computer System Interface), PCI express, ATA, PATA (Parallel ATA), SATA (Serial ATA), SAS (Serial Attached SCSI), and the like.

The buffer memory 1220 may temporarily store write data provided from the host 1100 or data read out from the nonvolatile memory device 1130. In the event that data existing in the nonvolatile memory device 1230 is cached, at a read request of the host 1100, the buffer memory 1220 may support a cache function to provide cached data directly to the host 1100. Typically, a data transfer speed of a bus format (e.g., SATA or SAS) of the host 1100 may be higher than that of a memory channel of the SSD 1200. That is, in the event that an interface speed of the host 1100 is relatively fast, lowering of the performance due to a speed difference may be minimized by providing the buffer memory 1220 having a large storage capacity.

The nonvolatile memory device 1230 may be used as a storage medium of the SSD 1200. The nonvolatile memory device 1230 may be formed of a vertical NAND flash memory with a mass storage capacity. The nonvolatile memory device 1230 may be formed of a plurality of memory devices. In this case, the memory devices of the nonvolatile memory device 1230 may be connected with the SSD controller 1210 by the channel unit. There is described an example in which as a storage medium, the nonvolatile memory device 1230 is formed of a NAND flash memory. However, the nonvolatile memory device 1230 is not limited to a NAND flash memory device. For example, a storage medium of the SSD 1200 can be formed of a PRAM, an MRAM, a ReRAM, a FRAM, a NOR flash memory, and the like. Further, the inventive concept may be applied to a memory system which uses different types of memory devices in combination. Each memory device of the nonvolatile memory device 1230 may be configured the same as that described with reference to 3.

In the SSD 1200, the nonvolatile memory device 1230 may perform a core recovery operation and a data output operation simultaneously or separately. In the event that the core recovery operation and the data output operation are performed simultaneously, the SSD controller 1210 may not issue a next command during a command wait time tRC even though a ready/busy signal RnB of the nonvolatile memory device 1230 has a high level.

Figure 19:
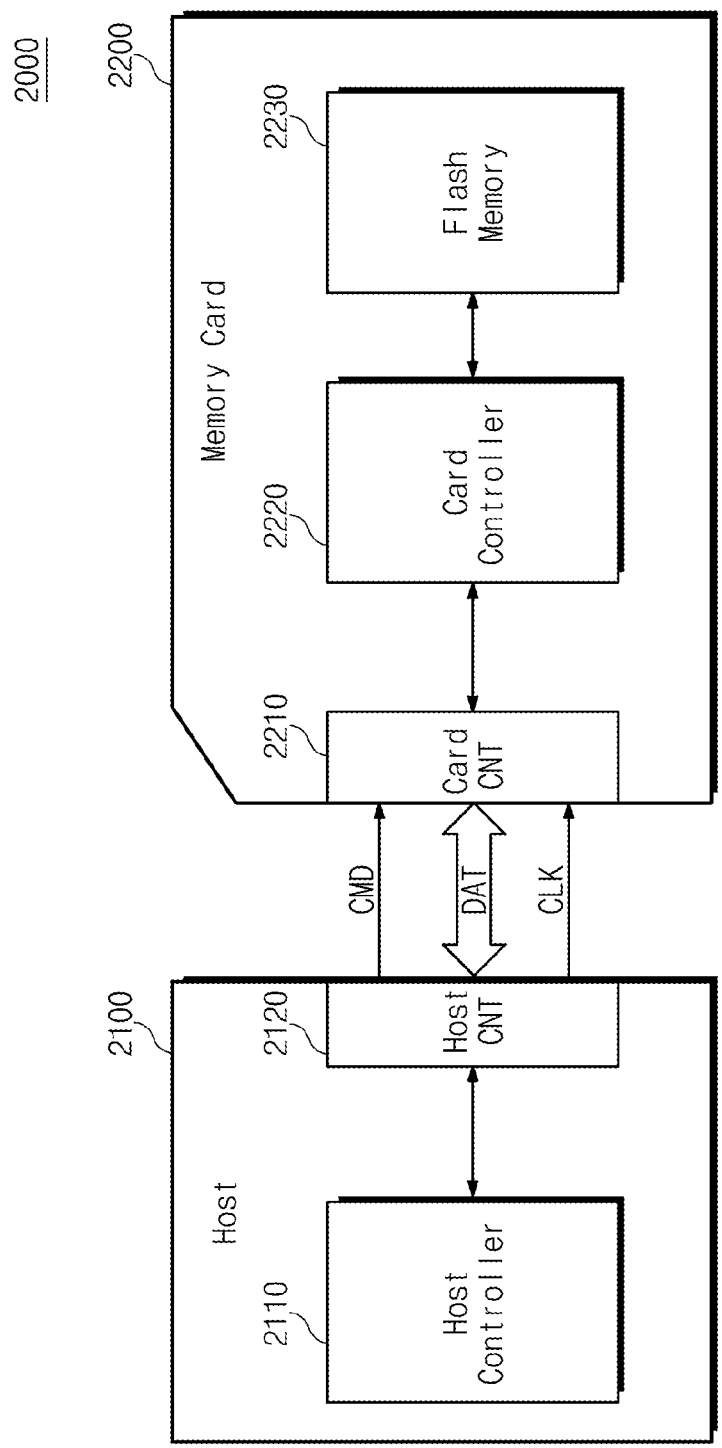
FIG. 19 is a block diagram illustrating a memory card according to an embodiment of the inventive concept.

FIG. 19 is a block diagram illustrating a memory card according to an embodiment of the inventive concept. Referring to FIG. 19, a memory card system 2000 may include a host 2100 and a memory card 2200. The host 2100 may include a host controller 2110 and a host connection unit 2120. The memory card 2200 may include a card connection unit 2210, a card controller 2220, and a flash memory 2230.

Each of the host connection unit 2120 and the card connection unit 2210 may be formed of a plurality of pins. Such pins may include a command pin, a data pin, a clock pin, a power pin, etc. The number of pins may vary according to a type of the memory card 2200. In example embodiments, an SD card may include nine pins.

The host 2100 may be configured to write data in the memory card 2200 or to read data stored in the memory card 2200. The host controller 2110 may send a command (e.g., a write command), a clock signal CLK generated within a clock generator (not shown) of the host 2100, and data to the memory card 2200 via the host connection unit 2120.

The card controller 2220 may operate responsive to a write command received via the card connection unit 2210, and may store data in the memory 2230 in synchronization with a clock signal generated by a clock generator (not shown) of the card controller 2220. The memory 2230 may store data transferred from the host 2100. For example, if the host 2100 is a digital camera, the memory 2230 may store image data.

The flash memory 2230 of the inventive concept may include memory cells stacked in a direction perpendicular to a substrate. The nonvolatile memory device 2230 may perform a core recovery operation and a data output operation simultaneously or separately. In the event that the core recovery operation and the data output operation are performed simultaneously, the card controller 2220 may not issue a next command during a command wait time tRC even though a ready/busy signal RnB of the nonvolatile memory device 2230 has a high level.

The card connection unit 2210 may be configured to communicate with an external device (e.g., a host) using one of various interface protocols such as USB, MMC, PCI-E, SAS, SATA, PATA, SCSI, ESDI, IDE, and the like.

A nonvolatile memory device and/or a memory controller may be packaged according to any of various packaging technologies such as PoP (Package on Package), Ball grid arrays (BGAs), Chip scale packages (CSPs), Plastic Leaded Chip Carrier (PLCC), Plastic Dual In-Line Package (PDI2P), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and the like.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A nonvolatile memory device, comprising:
a cell array including a plurality of cell strings extending on a substrate in a vertical direction, memory cells in each of the cell strings being controlled by a plurality of word lines and a plurality of bit lines;
a page buffer connected to the plurality of bit lines and configured to store sensing data of the cell array in a sensing operation;
a voltage generator configured to apply a bias voltage to at least one of the plurality of word lines and the plurality of bit lines prior to the sensing operation and to enable execution of the sensing operation;
an input/output buffer configured to output the sensing data to an external device before completion of a recovery operation, in which the bias voltage applied to the at least one of the plurality of word lines and plurality of bit lines for the sensing operation is discharged; and
a control logic configured to set a status of the nonvolatile memory device to a ready state before the recovery operation of the cell array from the applied bias voltage of the sensing operation is completed, wherein:
the control logic is configured to provide the page buffer with a dump signal such that the sensing data is dumped from the page buffer to the input/output buffer, and
the control logic comprises a status generator configured to set the status to the ready state in response to the dump signal.

2. The nonvolatile memory device of claim 1, wherein the control logic controls the input/output buffer in response to a read enable signal to output the sensing data to the external device.

3. The nonvolatile memory device of claim 1, wherein the status is set by controlling a ready/busy signal indicating whether the nonvolatile memory is in a busy state or the ready state.

4. The nonvolatile memory device of claim 1, wherein the status is output in response to a status read command from the external device.

5. The nonvolatile memory device of claim 1, wherein the control logic is configured to set the status to the ready state before or after the recovery operation from the applied bias voltage according to a read mode.

6. The nonvolatile memory device of claim 5, wherein the read mode is selected using a read command.

7. A control method of a memory system, the memory system including a memory controller and a nonvolatile memory device, the method comprising:

transmitting a read command from the memory controller to the nonvolatile memory device;

transitioning a busy/ready status signal of the nonvolatile memory device from a ready state to a busy state in response to receiving the read command;

applying a bias voltage to a word line or bit line of a memory cell array of the nonvolatile memory device after transitioning the busy/ready status signal to the busy state;

sensing data of the memory cell array by loading the data in a page buffer of the nonvolatile memory device after applying the bias voltage;

dumping the sensed data from the page buffer to an input/output buffer of the nonvolatile memory device;

performing a recovery operation of the memory cell array in which the bias voltage applied to the word line or bit line is discharged; and transitioning the busy/ready status signal of the nonvolatile memory device from the busy state to the ready state during the recovery operation of the memory cell array.

8. The control method of claim 7, further comprising the memory controller delaying transmission of a next command to the nonvolatile memory device until a reference time elapses after the busy/ready status signal transitions from the busy state to the ready state.

9. The control method of claim 8, wherein the reference time is a time taken to perform the recovery operation.

10. The control method of claim 7, further comprising transmitting the data from the input/output buffer to the memory controller when the busy/ready status signal is transitioned to the ready state.

11. The control method of claim 9, wherein the recovery operation is performed in parallel with at least a portion of the transmitting of the data from the input/output buffer to the memory controller.

12. The control method of claim 10, wherein the recovery operation includes an operation of resetting at least one of a word line voltage, a bit line voltage, a common source line voltage, a bulk voltage, a charge pump voltage, and selection line voltages generated in the nonvolatile memory device.

13. The control method of claim 11, wherein the memory cell array of the nonvolatile memory device is a three-dimensional memory cell array.

14. A nonvolatile memory device comprising:

a cell array including a plurality of cell strings extending on a substrate in a vertical direction, memory cells in each of the cell strings being controlled by a plurality of word lines and a plurality of bit lines;

a page buffer connected to the plurality of bit lines and configured to store sensing data of the cell array in a sensing operation;

a voltage generator configured to apply a bias voltage to at least one of the plurality of word lines and the plurality of bit lines prior to the sensing operation and to enable execution of the sensing operation; and an input/output buffer configured to output the sensing data to an external device before completion of a recovery operation, in which the bias voltage applied to the at least one of the plurality of word lines and plurality of bit lines for the sensing operation is discharged, wherein:

the control logic is configured to set the status to the ready state before or after the recovery operation from the applied bias voltage according to a read mode, and the read mode is selected using a set feature command.

\* \* \* \* \*